United States Patent [19]
Campbell et al.

[11] Patent Number: 5,430,404
[45] Date of Patent: Jul. 4, 1995

[54] OUTPUT DRIVER CIRCUITS WITH ENHANCED SUPPLY-LINE BOUNCE CONTROL AND IMPROVED $V_{OH}$ CHARACTERISTIC

[75] Inventors: David L. Campbell, Sunnyvale; James E. Fox, Jr., San Jose, both of Calif.

[73] Assignee: Integrated Device Technology, Inc., Santa Clara, Calif.

[21] Appl. No.: 968,116

[22] Filed: Oct. 28, 1992

[51] Int. Cl.[6] .................. H01L 25/00; H03K 5/12
[52] U.S. Cl. ........................... 327/566; 327/565; 327/170; 327/379
[58] Field of Search ............... 307/263, 572, 584, 443, 307/270, 303.1, 303.2, 303

[56] References Cited

U.S. PATENT DOCUMENTS

| | | |
|---|---|---|
| 4,087,704 | 5/1978 | Mehta et al. |
| 4,985,644 | 1/1991 | Okihara et al. ............ 307/443 |
| 5,008,568 | 4/1991 | Leung et al. .............. 307/443 |
| 5,097,149 | 3/1992 | Lee ........................... 307/443 |
| 5,135,173 | 5/1994 | Lee et al. ................... 307/263 |
| 5,138,194 | 8/1992 | Yoeli ......................... 307/443 |
| 5,148,056 | 9/1992 | Glass et al. ................ 307/443 |
| 5,191,244 | 3/1993 | Runaldue et al. ......... 307/443 |
| 5,214,320 | 5/1993 | Truong ..................... 307/443 |
| 5,218,239 | 6/1993 | Boomer .................... 307/263 |
| 5,254,890 | 10/1993 | Wang et al. .............. 307/443 |

Primary Examiner—Timothy P. Callahan
Assistant Examiner—Toan Tran
Attorney, Agent, or Firm—Skjerven, Morrill, MacPherson, Franklin & Friel; T. Lester Wallace; Larry E. Lycke

[57] ABSTRACT

An output driver circuit capable of driving its data output terminal to a digital logic level high, capable of driving its data output terminal to a digital logic level low, and capable of tristating its data output terminal has an output stage comprising a pullup field effect transistor (FET) and a like-polarity pulldown FET. The two pullup and pulldown FETs are coupled in series between two voltage supply lines. In one aspect of the invention, the output driver comprises a charge rate control circuit which charges the gate of the pulldown FET when the pulldown FET is to be turned on so that the voltage on the gate increases at a first rapid rate and then increases at a second slower rate after the pulldown FET begins to conduct current. In another aspect of the invention, a resistive element is provided between the source of the pulldown FET and a ground voltage supply line. In another aspect of the invention, the output driver circuit comprises a bulk potential control circuit which changes the voltage of the semiconductor bulk in which the pullup FET is disposed. Accordingly, bounce on the voltage supply lines is minimized, propagation delay through the output driver is minimized, and the output driver is suitable for use in applications requiring the handling of live insertion.

14 Claims, 32 Drawing Sheets

KEY TO FIG. 13

| FIG. 13a | FIG. 13b | FIG. 13c |
|---|---|---|

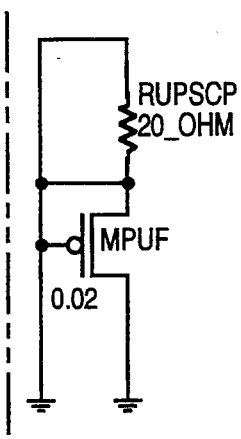
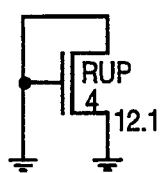
FIG. 14c
KEY TO
FIG. 14
| FIG. 14a | FIG. 14b | FIG. 14c |
|---|---|---|
|  |  |  |

KEY TO FIG. 15

| FIG. 15a | FIG. 15b | FIG. 15c |

KEY TO

| FIG. 16a | FIG. 16b | FIG. 16c |
|---|---|---|
| | | |

KEY TO

| FIG. 17a | FIG. 17b | FIG. 17c |
|---|---|---|

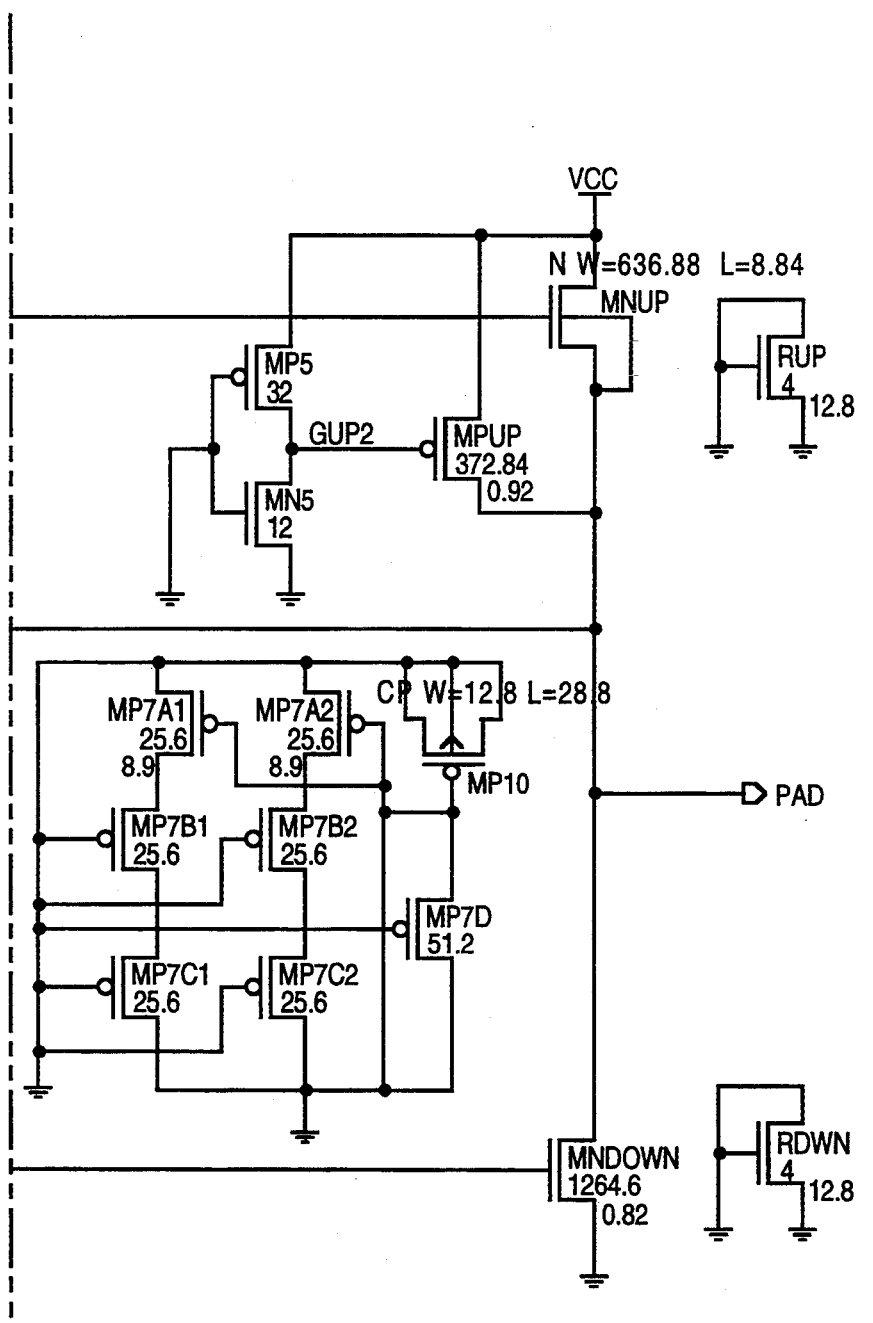
FIG. 18b
KEY TO FIG. 18
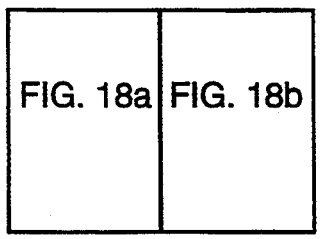

KEY TO FIG. 19

| FIG. 19a | FIG. 19b |

KEY TO FIG. 20

| FIG. 20a | FIG. 20b |

KEY TO FIG. 21

| FIG. 21a | FIG. 21b |

OUTPUT DRIVER CIRCUITS WITH ENHANCED SUPPLY-LINE BOUNCE CONTROL AND IMPROVED $V_{OH}$ CHARACTERISTIC

FIELD OF THE INVENTION

This invention relates to electronic circuitry suitable for use in a semiconductor integrated circuit. More specifically, this invention relates to circuits that employ complementary insulated-gate field-effect transistors.

BACKGROUND INFORMATION

An output driver (sometimes called an "output buffer") is an electronic circuit that furnishes one or more output signals at voltage/current levels suitable to drive a load such as another circuit, or a bus. Multiple different output driver structures have been realized using complementary field effect transistor (CMOS) technology. A CMOS output driver uses both P-channel and N-channel insulated-gate field effect transistors (FETs). By using CMOS technology, an output driver circuit can typically be designed to consume a relatively small amount of power.

One possible application for a CMOS output driver circuit is an interface between a digital logic circuit and a bus operating at transistor-transistor logic (TTL) voltage levels. The commercially available 74FCT245, 74FCT16245, 74FCT162245, 74FCT163245, 74FCT164245, 74FCT245T, and 74FCT3245 are examples of parts containing CMOS output driver circuits. Due to the use of both P-channel and N-channel FETs in a CMOS output driver circuit, the internal circuitry of the typical CMOS output driver circuit operates at CMOS digital voltage levels, i.e. a CMOS high digital logic voltage level is usually a voltage between the Vcc supply voltage and Vcc/2 whereas a CMOS low digital logic voltage level is usually a voltage between ground and Vcc/2. The signal output from the CMOS output driver and onto the bus must, however, drive the bus at the appropriate voltage and current levels to satisfy requirements of any TTL and/or CMOS digital logic circuitry connected to the bus. This means that the CMOS output driver circuit must output a voltage between the minimum $V_{OH}$ (minimum TTL $V_{OH}$ or the minimum high digital logic level output voltage for TTL logic is 2.4 volts) to Vcc (TTL Vcc is 5.0 volts typically plus or minus ten percent) in order to output a high digital logic level onto the bus. This also means, however, that the CMOS output driver must output a voltage between ground and the maximum $V_{OL}$ (maximum TTL $V_{OL}$ or the maximum low digital logic level output voltage for TTL is 0.5 volts) in order to drive the bus with a low digital logic voltage level.

FIG. 1 shows a conventional CMOS output driver circuit 1 having a data input terminal 2, an enable/disable input terminal 3, a data output terminal 4, four digital logic gates 5–8, a first N-channel output transistor 9, a second N-channel output transistor 10, a resistive element 11, an internal high $V_{HI}$ voltage supply line 12, and an internal low $V_{LI}$ voltage supply line 13. Digital logic gates 5–8 are shown surrounded by a dashed box 14 into which the internal high and internal low voltage supply lines 12 and 13 extend. This indicates that digital logic gates 5–8 are powered by the internal high and low voltage supply lines 12 and 13. The resistive element 11 is coupled between the $V_{HI}$ voltage supply line 12 and the drain of the first N-channel output transistor 9. Both the source of the first N-channel output transistor 9 and the drain of the second N-channel output transistor 10 are connected to the data output terminal 4. The source of the second N-channel output transistor 10 is connected to the internal low $V_{LI}$ voltage supply line 13.

In operation, interconnected gates 5–8 receive digital logic voltage level signals on both the data input terminal 2 and also on the enable/disable input terminal 3. From these digital voltage level signals, gates 5–8 generate appropriate control signals $V_{UP}$ and $V_{DN}$ to control the first and second output transistors 9 and 10 respectively so that the data output terminal 4 is either coupled to the internal high $V_{HI}$ voltage supply line 12, coupled to the internal low $V_{LI}$ voltage supply line 13, or is decoupled altogether from both internal voltage supply lines 12 and 13.

If, for example, the conventional output driver of FIG. 1 is enabled by a high digital logic voltage level signal being present on the enable/disable input terminal 3, then gates 5–8 cause the data output terminal 4 to be driven to a digital logic voltage level corresponding to the digital logic voltage level present on the data input terminal 2. If, for example, a digital logic level high signal is present on data input terminal 2, then the first N-channel transistor 9 is turned on and the second N-channel transistor 10 is turned off. The data output terminal 4 is therefore coupled to the internal high $V_{HI}$ voltage supply line 12 through conductive output transistor 9 and resistive element 11 and is decoupled from the internal low $V_{LI}$ voltage supply line 13 by nonconductive second output transistor 10. If, on the other hand, a digital logic level low signal is present on data input terminal 2, then the first N-channel output transistor 9 is turned off and the second N-channel output transistor 10 is turned on. The data output terminal 4 is therefore decoupled from the internal high $V_{HI}$ voltage supply line 12 by nonconductive first output transistor 9 and is coupled through the conductive second output transistor 10 to the internal low $V_{LI}$ supply line 13.

In conditions where the conventional output driver of FIG. 1 is to be disabled by a low digital logic voltage level signal present on the enable/disable input terminal 3, gates 5–8 cause the data output terminal 4 to be simultaneously decoupled from both internal voltage supply lines 12 and 13 regardless of the digital logic voltage level present on the data input terminal 2. A low digital logic level signal present on the enable/disable input terminal 3 causes both the first and the second N-channel output transistors 9 and 10 to be turned off, thereby decoupling the data output terminal 4 from both the internal voltage supply lines 12 and 13 regardless of the digital logic voltage level of a signal present on data input terminal 2.

As the switching speed of such conventional output driver circuits increases due to ever decreasing transistor geometries and due to other improvements in semiconductor processing technology, a number of problems are experienced with the above-described output driver structure.

A first problem is voltage "bounce" on the voltage supply lines. A physical electrical connection has an associated intrinsic inductance. An inductance therefore necessarily exists due to the physical electrical connection from the circuitry of the output driver, through the voltage supply lines on the integrated circuit die of the output driver, through the electrical connections connecting the integrated circuit die of the output driver to the integrated circuit package housing the output driver, and through the electrical connections of the package which provide electrical connection to an externally accessible physical terminal on the exterior of the package. Accordingly, an inductance 12a is illustrated in FIG. 1 as existing between an external high $V_{HE}$ voltage supply terminal 12b and the internal high $V_{HI}$ voltage supply line 12. Similarly, an inductance 13a is illustrated as existing between an external low $V_{LE}$ voltage supply terminal 13b and the internal low $V_{LI}$ voltage supply line 13.

Letting "dI/dt" represent the time rate of change of the current "I" flowing through an inductance of magnitude "L", the magnitude of the voltage change "V" across the inductance is given by: V=L dI/dt. It is therefore seen that the magnitude of the voltage change or "bounce" on an internal voltage supply line is equal to the product of the voltage supply line inductance and the speed at which a current of a given magnitude flowing through the voltage supply line inductance changes. Accordingly, turning the N-channel output transistors of an output driver on and off in smaller and smaller periods of time to decrease $V_{IN}$ to $V_{OUT}$ propagation delay results in a larger and larger bounce. Bounce appearing on the internal high $V_{HI}$ voltage supply line is commonly called "supply line bounce". Bounce appearing on the internal low $V_{LI}$ supply line is commonly called "ground bounce".

Special attention should be paid to bounce when an integrated circuit contains a number of output drivers arranged in parallel, as in an application in which a bus is being driven by output drivers. In this case, many or all the output drivers may be commonly switched together at the same time. Accordingly, the magnitude of the current being switched over an internal voltage supply line of the integrated circuit may be large and the resultant magnitude of the voltage bounce on the internal voltage supply line may be severe.

A second problem associated with the above-described conventional output driver structure is known as "live-insertion". A CMOS output driver may, for example, be fabricated on an N-type semiconductor substrate. P-type wells are formed in the N-type substrate and the sources and drains of the N-channel output transistors are formed in the P-type wells. The N-type substrate is coupled to the high voltage supply to prevent the PN junctions between the P-wells and the N-type substrate from becoming forward biased. FIG. 2 is a simplified cross-sectional illustration of a part of the conventional output driver of FIG. 1.

A problem occurs in bus applications, however, wherein the data output terminal of an unpowered output driver must be capable of being physically placed in electrical contact, either directly or indirectly via an intermediate conducting mechanism, with a "live" bus line without detrimentally affecting the operation of either the bus line or the output driver. This situation commonly occurs when a printed circuit board carrying a CMOS output driver is plugged into a connector of a live bus on the backplane of a computer. Plugging the printed circuit board into the backplane couples the power and ground supply voltages to the output driver circuit and also couples a live bus line on the backplane to the data output terminal of the output driver integrated circuit. The internal high voltage supply line of the output driver integrated circuit may, therefore, not yet be powered for a period of time when the data output terminal is already connected to a "live" signal on the bus line of the backplane. If any P-region such as a P-well or a source or a drain of a P-channel transistor of a CMOS gate disposed in the N-type substrate of the output driver is connected to the data output terminal of the output driver during this time, a PN junction between the P region and the N-type substrate may become forward biased when a high digital logic voltage level is present on the backplane bus line. This forward biasing cannot be tolerated.

A prior art solution (see FIG. 2) to this problem is to tie all the P-wells permanently to the internal low supply voltage line and not to connect any other P regions in the output driver to the data output terminal. Permanently grounding the P-well containing the first output N-channel transistor in the above-mentioned output driver, however, detrimentally affects the minimum $V_{OH}$; that is $V_{OH}$ minimum is lower in amplitude than desired. Accordingly, it is desirable to find a way to prevent this unwanted lowering of $V_{OH}$ minimum.

Another prior art solution is to add a process step which modifies the back biased threshold voltage in the first output transistor to achieve a higher output voltage when the source to bulk voltage equals, for example, 2.4 volts. Unfortunately, adding a process step increases the cost of the device.

SUMMARY OF THE INVENTION

In accordance with the present invention, an output driver circuit contains a drive control section, and like-polarity first and second output transistors arranged in a totem configuration between an internal high $V_{HI}$ voltage supply line and an internal low $V_{LI}$ voltage supply line. Typically the internal high $V_{HI}$ voltage supply line is connected to an external source of Vcc and typically the internal low $V_{LI}$ voltage supply line is connected to an external ground. Vcc is typical 5.0 volts plus or minus ten percent with respect to the external ground.

In one embodiment of the present invention, the first output transistor has a drain, a source coupled to a data output terminal, and a gate electrode responsive to a first control signal. The second output transistor has a drain coupled to the data output terminal, a source, and a gate electrode responsive to a second control signal. The first and second output transistors typically are insulated-gate devices such as N-channel insulated-gate field effect transistors. The drive control section controls the first and second output transistors by generating the appropriate first and second control signals in response to one or more digital input signals present on one or more data input terminals and/or in response to a digital enable/disable input signal present on an enable/disable input terminal.

In accordance with a first aspect of the invention, the drive control section generates the second control signal so that the second control signal charges the gate of the second output transistor at a first rapid rate and then subsequently at a second slower rate. This charging of the gate of the second output transistor at two rates occurs when the second output transistor is to be turned on to drive the voltage on the data output terminal from a digital logic level high to a digital logic level low. Due to the dependence of ground bounce on the rate of change of the current flowing into the internal low $V_{LI}$ supply voltage line, rapid changes in current flow through the second transistor are to be avoided. An MOS transistor such as the second transistor does not, however, conduct substantial current for gate to source voltages of less than Vt. In order to achieve a short propagation delay from the data input terminal to the data output terminal through the output driver, the drive control section of the invention increases the voltage on the gate of the second transistor rapidly until the gate to source voltage reaches approximately Vt where the second transistor will begin to conduct substantial current. The drive control section then increases the voltage on the gate of the second transistor at a second slower rate so that current flow in the second transistor will increase more slowly thereby avoiding large values of dI/dt and thereby avoiding ground bounce problems on the internal low $V_{LI}$ voltage supply line.

In accordance with a second aspect of the invention, a resistive element is coupled between the source of the second transistor and the internal low $V_{LI}$ supply voltage line to provide better control of the rate of current increase through the second transistor. Accurately anticipating and controlling the drain-to-source current flow through an MOS transistor as a function of gate-to-source voltage is often difficult in the saturation region of transistor operation due to process variations, supply voltage variations, and temperature dependencies of MOS transistors. Adding the resistive element allows the gate of the second transistor to be driven on "hard", the magnitude of the peak drain-to-source current flowing through the second transistor, the magnitude of dI/dt flowing through the second transistor, and the magnitude of the ground bounce on the internal low $V_{LI}$ supply voltage line during high-to-low voltage transitions on the data output terminal being limited by the resistance of the resistive element. The resistance of the resistive element is more predictable over temperature and process variations than is the response of a MOS transistor.

In accordance with a third aspect of the invention, the drive control section dynamically controls the voltage of the bulk semiconductor region in which the first output transistor is disposed. In one embodiment of the present invention, like-polarity first and second output transistors are N-channel insulated-gate field effect transistors, the first output transistor being formed in a first P-well, the second output transistor being formed in a second P-well. The drive control section of the present invention controls the voltage of the P-well containing the first output transistor: 1) to have a high voltage when the output driver is powered and enabled to drive the data output terminal with a high digital logic voltage level, 2) to have a low voltage when the output driver is powered and enabled to drive the data output terminal with a low digital logic voltage level, 3) to have a low voltage when the output driver is powered and disabled, and 4) to float, decoupled from both internal voltage supply lines and from the data output terminal, when the output driver is not powered.

Accordingly, if the data output terminal is to be driven by the output driver to a digital high voltage level, then the P-well containing the first N-channel transistor is driven with a high voltage level thereby allowing the first transistor to pull the voltage on the data output terminal to a high level. This results in the output driver circuit having an optimally high minimum $V_{OH}$. If, on the other hand, the data output terminal is to be driven by the output driver to a digital low voltage level, then the P-well containing the first N-channel transistor is driven with a low voltage thereby preventing the PN junction between the N-type source or drain of the first transistor connected to the data output terminal and the P-well containing the first transistor from becoming forward biased. Similarly, if the data output terminal is to be disabled, then the P-well is driven with a low voltage to prevent the PN junction between the N-type source or drain of the first transistor and the P-well containing the first transistor from becoming forward biased due to a digital low voltage driven onto the data output terminal by another device coupled to the data output terminal. In the condition where the output driver is unpowered, the P-well voltage is isolated from the internal voltage supply lines of the output driver and from the data output terminal so that the P-well floats. The voltage at which the P-well floats is not sufficiently high to detrimentally forward bias the PN junction between the P-well and the N-type substrate nor is the voltage of the P-well adequately high to detrimentally forward bias the PN junction between the N-type source or drain and the P-well. The operation of the drive control section therefore overcomes the above-mentioned live insertion problem, increases the minimum $V_{OH}$ of the circuit, and makes the driver suitable for use in backplane applications.

DETAILED DESCRIPTION OF THE PREFERRED EMBODIMENTS

Figure 1:
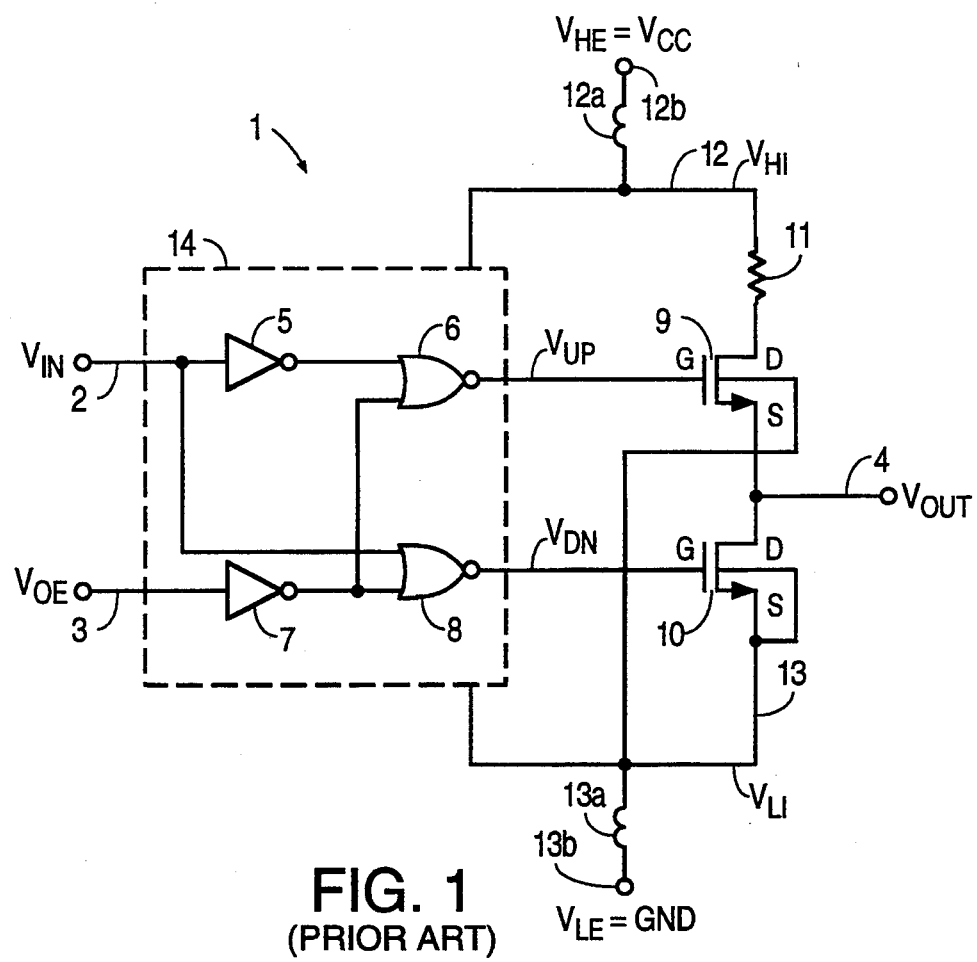
FIG. 1 (Prior Art) is an illustration of a conventional output driver.
Figure 2:
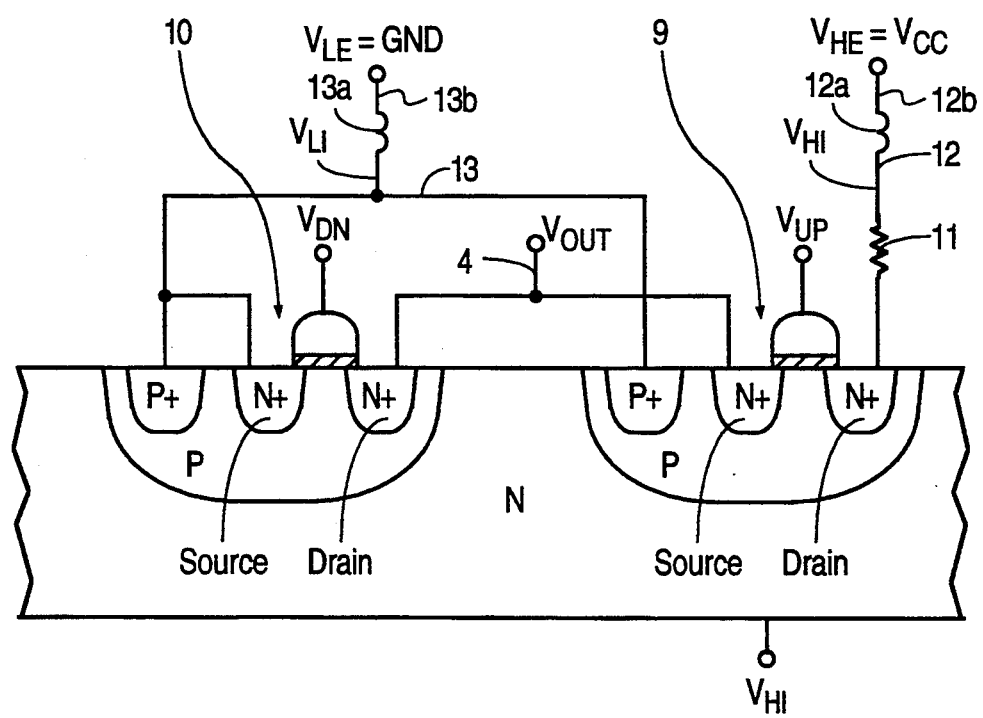
FIG. 2 (Prior Art) is an illustrative simplified cross-sectional structural diagram showing part of the output driver of FIG. 1.
Figure 3:
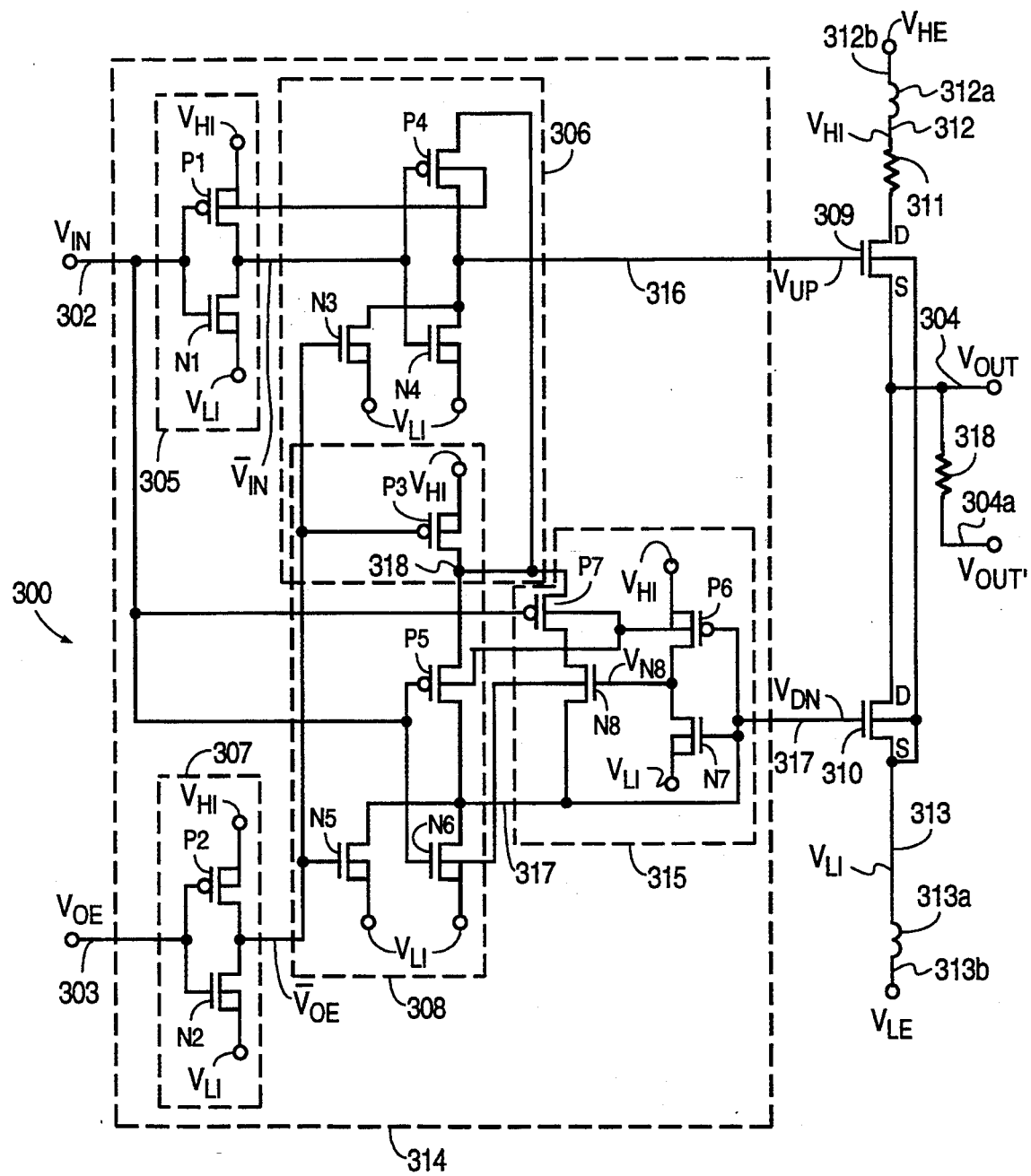
FIG. 3 is a simplified circuit diagram of a first embodiment of an output driver in accordance with the invention.

FIG. 3 illustrates a digital output driver circuit 300 in accordance with the present invention. The output driver 300 is formed on a semiconductor die (not shown) of a packaged integrated circuit (not shown). The die usually contains a group of drivers of this type arranged in parallel for driving a multi-wire communications bus. Only one output driver circuit 300 of such a group is illustrated in FIG. 3 for clarity of illustration and explanation.

Output driver 300 comprises a CMOS drive control section 314, a first output N-channel enhancement-mode insulated-gate field effect transistor 309, a second output N-channel enhancement-mode insulated-gate field effect transistor 310, a resistive element 311, a data input terminal 302, enable/disable input terminal 303, a data output terminal 304, an external high supply voltage terminal 312b, and an external low supply voltage terminal 313b.

Electrical power to drive circuit elements on the die is supplied from an external source (not shown) which provides an external high supply voltage $V_{HE}$ and an external low supply voltage $V_{LE}$. These external supply voltages $V_{HE}$ and $V_{LE}$ are furnished to external integrated circuit terminals 312b and 313b, respectively. Terminals 312b and 313b are coupled to internal voltage supply lines 312 and 313 that respectively carry internal high and low supply voltages $V_{HI}$ and $V_{LI}$ to the circuit elements on the die. Inductances 312a and 313a represent inductances associated with the respective electrical connections connecting the external terminals 312b and 313b to the internal voltage supply lines 312 and 313.

The drive control section 314 is a circuit that produces drive control signals $V_{UP}$ and $V_{DN}$ in response to a digital logic level data input signal $V_{IN}$ on data input terminal 302 and in response to an enable/disable digital logic level input signal $V_{OE}$ on enable/disable input terminal 303. The drive control section 314 comprises a CMOS inverter 305, a CMOS inverter 307, a CMOS NOR gate 306, a CMOS NOR gate 308, and a charge rate control circuit 315.

CMOS inverters 305 and 307 produce output voltage signals $\overline{V}_{IN}$ and $\overline{V}_{OE}$ as the respective logical inverses of input voltage signals $V_{IN}$ and $V_{OE}$. CMOS inverter 305 comprises a P-channel pullup transistor P1 and a N-channel pulldown transistor N1 configured as a standard CMOS inverter. CMOS inverter 307 comprises a P-channel pullup transistor P2 and a N-channel pulldown transistor N2 configured as a standard CMOS inverter.

CMOS NOR gate 306 generates drive control signal $V_{UP}$ onto first control lead 316 as the logical NOR of voltage signals $\overline{V}_{IN}$ and $\overline{V}_{OE}$. CMOS NOR gate 306 comprises two series-connected P-channel pullup transistors P3 and P4 and two parallel-connected N-channel pulldown transistors N3 and N4 connected together as a two-input NOR gate.

CMOS NOR gate 308 generates drive signal $V_{DN}$ onto second control lead 317 as the logical NOR of voltage signals $V_{IN}$ and $\overline{V}_{OE}$. CMOS NOR gate 308 comprises two series-connected P-channel pullup transistors P3 and P5 and two parallel-connected N-channel pulldown transistors N5 and N6 connected together as a two-input NOR gate. In the embodiment shown in FIG. 3, P-channel pullup transistor P3 is shared between the two NOR gates 306 and 308.

Charge rate control circuit 315 comprises P-channel transistors P6 and P7 as well as N-channel transistors N7 and N8. P-channel transistor P7 and N-channel transistor N8 are connected in series between node 319 of NOR gate 308 and second control lead 317. The source of P-channel transistor P7 is coupled to node 319; the drain of P-channel transistor P7 is coupled to the drain of N-channel transistor N8; and the source of N-channel transistor N8 is coupled to second control lead 317. Accordingly, these two transistors P7 and N8 conduct current from node 319 to second control lead 317 when both transistors P7 and N8 are controlled to be on. The gate of transistor N8 is controlled by a CMOS inverter comprising P-channel transistor P6 and N-channel transistor N7. The input lead of this inverter is coupled to second control lead 317 whereas the output lead of this inverter is coupled to the gate of transistor N8. The gate of transistor P7 is coupled to data input terminal 302 so data input signal $V_{IN}$ controls transistor P7.

First and second N-channel output transistors 309 and 310 are connected in a totem configuration between internal high and low voltage supply lines 312 and 313. Drive voltage signals $V_{UP}$ and $V_{DN}$ are furnished to the gate electrodes of first and second output transistors 309 and 310, respectively. An output voltage $V_{OUT}$ is taken from a data output terminal 304 connected to the source of first output transistor 309 and to the drain of second output transistor 310. Resistive element 311 is connected between the drain of first output transistor 309 and the internal high $V_{HI}$ voltage supply line 312. The source of second output transistor 310 is connected to the internal low $V_{LI}$ voltage supply line 313.

Figure 4:
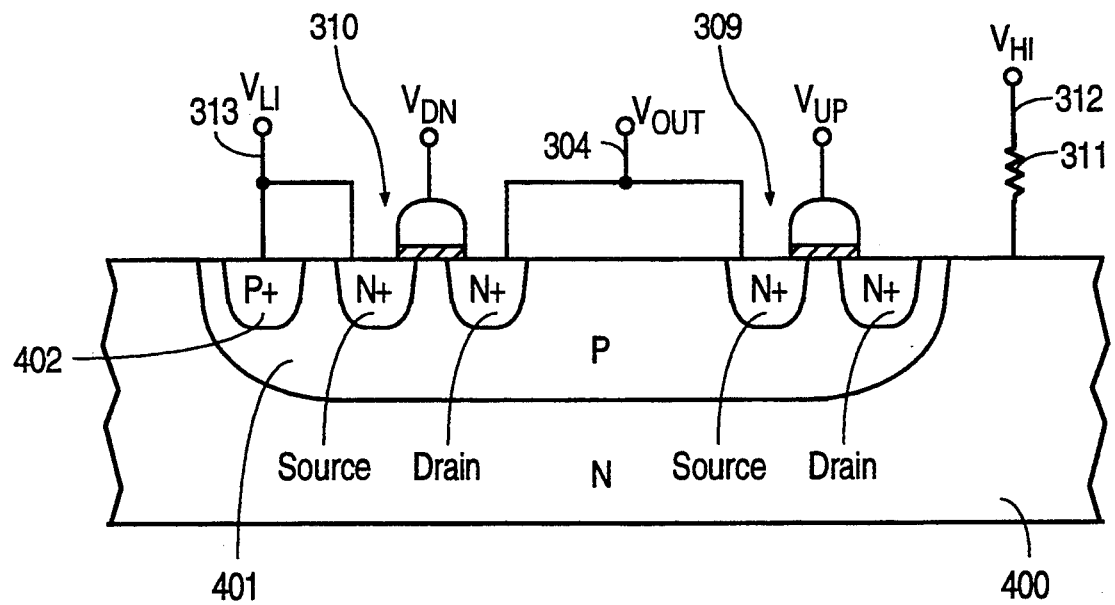
FIG. 4 is an illustrative simplified cross-sectional structural diagram showing part of the output driver of FIG. 3.

As shown in FIG. 4, the output driver of FIG. 3 is preferably fabricated on an N-type monocrystalline silicon semiconductor substrate 400. The source and drain regions of the first and second N-channel output transistors 309 and 310 are formed in a semiconductor bulk region such as P-well 401. The N+ source region of first output transistor 309 is shown connected to the N+ drain region of second output transistor 310 at data output terminal 304. A P+ region 402 in the P-well 401 serves as metal to silicon contact for controlling the voltage of the P-well.

The output driver of FIG. 3 operates as follows. Input voltages $V_{IN}$ and $V_{OE}$ each switch between low and high digital logic voltage levels. The low input logic level is near $V_{LE}$, while the high input logic level is near $V_{HE}$. In response to input signals $V_{IN}$ and $V_{OE}$, drive control section 314 switches drive voltages $V_{DN}$ and $V_{UP}$ between a low logic level near $V_{LE}$ and a high logic level near $V_{HE}$.

When high digital logic signal $V_{OE}$ is present on enable/disable terminal 303, the output driver 300 is enabled. In this case, the signal $V_{IN}$ present on the data input terminal 302 controls drive voltages $V_{DN}$ and $V_{UP}$ in such a manner that one of them is high while the other is low. Consequently, one of output transistors 309 and 310 is on while the other is off. In particular, if $V_{IN}$ is low, then $V_{UP}$ is low and $V_{DN}$ is high. Thus, first transistor 309 is off and second transistor 310 is on to pull output voltage $V_{OUT}$ on data output terminal 304 down to a low digital logic level. If, on the other hand, $V_{IN}$ is high, then $V_{UP}$ is high and $V_{DN}$ is low. Thus, second transistor 310 is off and first transistor 309 is on to pull output voltage $V_{OUT}$ on data output terminal 304 up to a high digital logic level.

When a low digital logic signal $V_{OE}$ is present on enable/disable input terminal 303, the output driver 300 is disabled. In this case, the drive control section 314 forces both drive voltages $V_{DN}$ and $V_{UP}$ low regardless of the level of data input signal input $V_{IN}$. Accordingly, both the first and second output transistors 309 and 310 are off and the data output terminal 304 is decoupled from both internal voltage supply lines 312 and 313.

The operation of the charge rate control circuit 315, however, prevents the second output transistor 310 from turning on too rapidly and thereby generating ground bounce on the internal low $V_{LI}$ voltage supply line 313. The situation where the second output transistor 310 may turn on too rapidly is the situation in which the input signal $V_{IN}$ present on data input terminal 302 transitions from a high digital logic level to a low digital logic level when the output driver is enabled. When $V_{IN}$ is high, N-channel transistor N6 of NOR gate 308 is on and P-channel transistor P5 of NOR gate 308 is off. The second control lead 317 therefore is held low by conductive transistor N6. When $V_{IN}$ transitions high-to-low, N-channel transistor N6 turns off and P-channel transistor P5 turns on. Because P-channel transistor P3 is already on due to $V_{OE}$ being high, current begins to flow in a first current path from internal high $V_{HI}$ voltage supply line 312, through P-channel transistor P3, through P-channel transistor P5, and onto second control lead 317 to charge the gate of second output transistor 310. Due to the operation of the charge rate control circuit 315, however, current also begins to flow in a second current path from internal high $V_{HI}$ voltage supply line 312, through P-channel transistor P3, through P-channel transistor P7, through N-channel transistor N8, and onto second control lead 317 to charge the gate of the second output transistor 310 still faster. Note that the gate of N-channel transistor N8 is held high by the inverter of transistors P6 and N7 when $V_{DN}$ is low. Accordingly, the high-to-low transitioning of $V_{IN}$ results in P-channel transistor P7 turning on and therefore opens the second current path from $V_{HI}$ to the gate of second output transistor 310.

Figure 5:
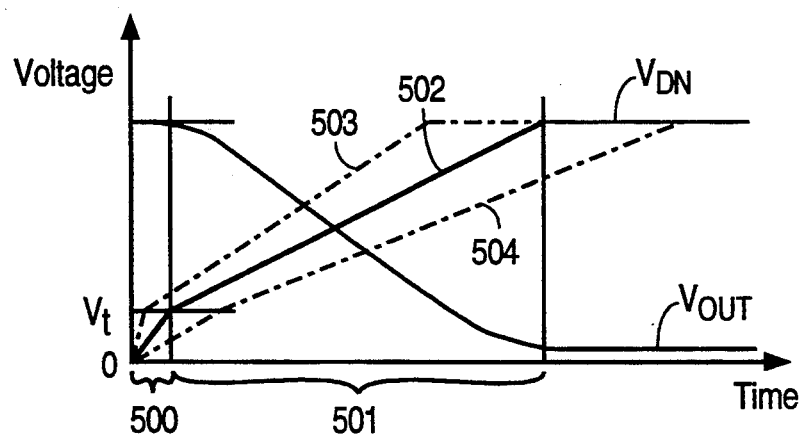
FIG. 5 is a diagram showing $V_{DN}$ and $V_{OUT}$ waveforms in accordance with the operation of the output driver of FIG. 3.

FIG. 5 shows the rapid charging of the gate of the second output transistor 310 through both the first and second current paths during an initial time period 500 when $V_{DN}$ (see waveform 502) is low. When the voltage $V_{DN}$ (see waveform 502) on the gate of second output transistor 310 reaches the threshold voltage $V_t$ of the inverter in the charge rate control circuit 315, the voltage on the output lead of the inverter of transistors P6 and N7 transitions high-to-low thereby turning N-channel transistor N8 off and thereby blocking the second current path. As a result, subsequent charging (see waveform 502) of the gate of second output transistor 310 is accomplished at a slower rate by current flowing through the first current path only. FIG. 5 shows the slower charging of the gate of the second input transistor 310 through only the first current path during subsequent time period 501. Because N-channel output transistor 310 does not conduct appreciable current between its drain and its source for voltages of $V_{DN}$ (see waveform 502) below Vt, the gate of the second output transistor 310 is charged rapidly in time period 500 without causing rapid changes in current flow through the second output transistor 310 which would exacerbate ground bounce problems on internal low $V_{LI}$ voltage supply line 313. Furthermore, by charging the gate of the second output transistor 310 so rapidly (see waveform 502) during time period 500, an output driver having a short high-to-low $V_{IN}$ to $V_{OUT}$ propagation delay is realized.

The rate of increase of $V_{DN}$ during initial time period 500 is controlled by controlling the length-to-width ratios of transistors P3, P5, P7 and N8 and the gate capacitance of the gate of the second output transistor 310. The rate of increase of $V_{DN}$ during subsequent time period 501 is controlled by controlling the length-to-width ratios of transistors P3 and P5 and the gate capacitance of the gate of the second output transistor 310. The three different waveforms 502, 503, and 504 for $V_{DN}$ illustrate possible variations in charge rates due to process parameter changes from die to die and wafer to wafer.

In one embodiment of this invention, resistive element 311 is formed as an extension of the N+ drain region of first output transistor 309. In another embodiment, resistive element 311 is formed as a thin film resistor on the surface of the semiconductor substrate. A typical thin film resistive element could comprise a layer of doped polycrystalline silicon formed to yield a desired resistive value. Alternatively, a thin film resistor could comprise a thin film tantalum resistor. Tantalum resistors can be laser trimmed to provide a desired resistance value.

Preferably, the timing of drive signals $V_{DN}$ and $V_{UP}$ and the threshold voltages of transistors 309 and 310 are such that transistors 309 and 310 operate in a "break before make" mode. That is, when $V_{OUT}$ is being driven low, transistor 309 turns off slightly before transistor 310 turns on. Likewise, when $V_{OUT}$ is being driven high, transistor 310 turns off slightly before transistor 309 turns on. This may be accomplished by making P-channel pullup transistors P4, P5 and P7 weak relative to their corresponding N-channel pulldown transistors. Power-usage efficiency is high because transistors 309 and 310 do not provide a conductive current path from the internal high $V_{HI}$ voltage supply line to the internal low $V_{LI}$ voltage supply line.

Output signal voltage $V_{OUT}$ is supplied via output terminal 304 to an integrated circuit package output terminal or pin on a package containing the output driver integrated circuit 300. In some embodiments, a further output voltage signal $V_{OUT}$ is furnished through a resistive element 318 to another data output terminal 304a. This output voltage signal $V_{OUT}$ is provided to other circuitry on the integrated circuit die.

In some embodiments, the output driver also includes a small circuit (not shown) that provides electrostatic-discharge ("ESD") protection for the data output terminal or pin which is externally accessible from the outside of the package. The ESD protection circuit consists of a P-channel FET and a conventional CMOS inverter whose input is tied to the internal low voltage $V_{LI}$ supply line 313 and whose output is connected to the gate of the P-channel device FET. The source and drain of the P-channel FET are respectively connected to the second output transistor 310 source and the internal high voltage $V_{HI}$ supply line 312.

Figure 6:
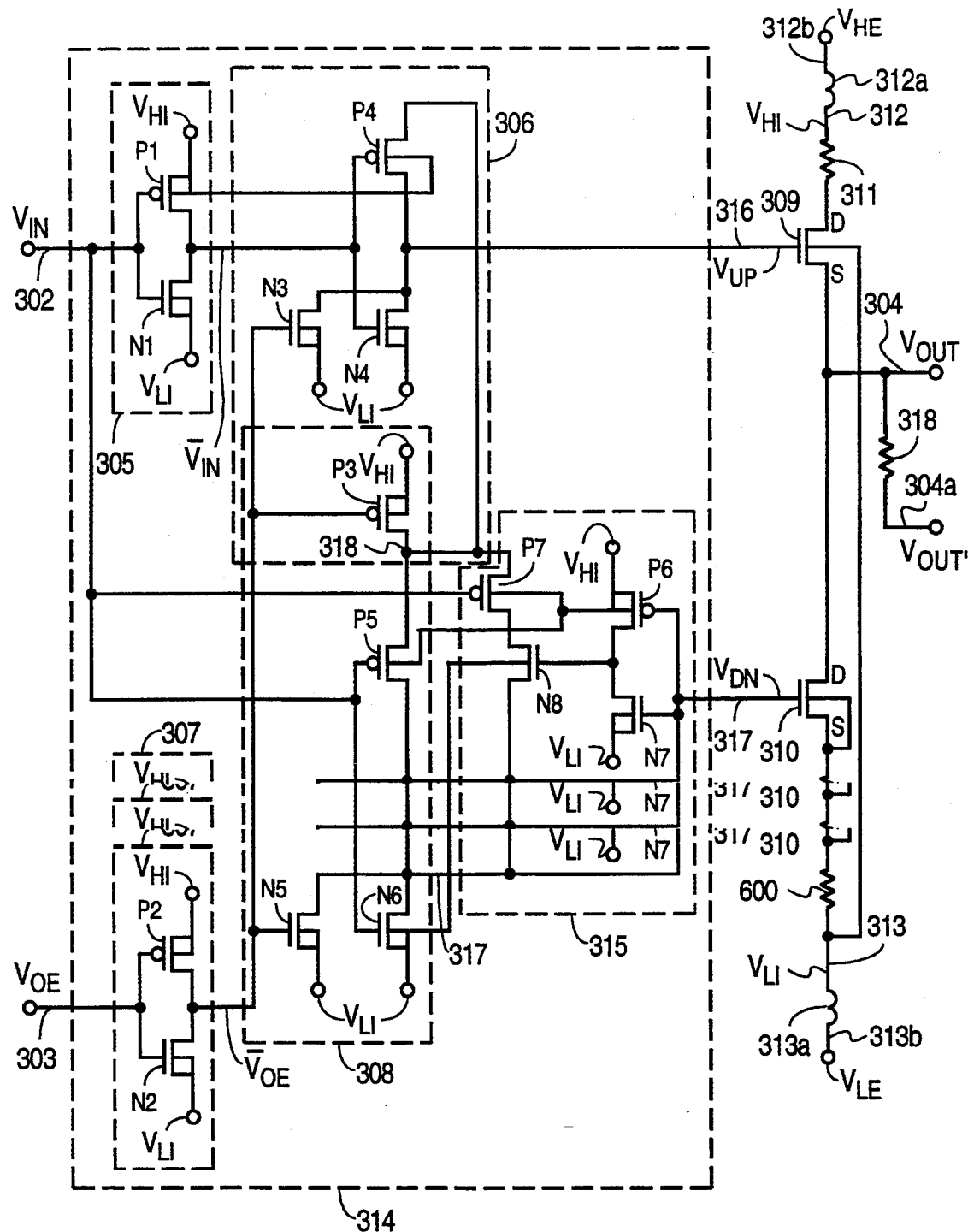
FIG. 6 is a circuit diagram of another embodiment of the output driver in accordance with the invention.

FIG. 6 shows another embodiment of the output driver in accordance with the invention. The output driver of FIG. 6 is similar to the circuit of FIG. 3 except for the provision of a second resistive element 600. Second resistive element 600 is coupled between second output transistor 310 and internal low voltage $V_{LI}$ supply line 313. The substrate bulk in which the first output transistor 309 is disposed is connected to internal low voltage $V_{LI}$ supply line 313 rather than the source of the second output transistor 310. The bulk of second output transistor 310 is coupled to the source of second output transistor 310.

The output driver of FIG. 6 can drive a load operating at TTL logic levels. The minimum TTL $V_{OH}$ is 2.4 volts. When first output transistor 309 is on, output current $I_{OH}$ flows from internal voltage supply line 312, through resistive element 311, through first output transistor 309, through the data output terminal 304, and to the load. Resistive element 311 limits $I_{OH}$ to approximately 24 mA at the indicated $V_{OH}$ of 2.4 volts. The maximum TTL $V_{OL}$ is 0.5 volts. When transistor 310 is on, output current $I_{OL}$ flows from the load, through second output transistor 310, through second resistive element 600, and to internal voltage supply line 313. If resistive element 600 were not present, $I_{OL}$ would be approximately 64 mA at the indicated TTL maximum $V_{OL}$ of 0.5 volts. Inclusion of resistive element 600 reduces $I_{OL}$ to approximately 24 mA at the indicated TTL maximum $V_{OL}$ of 0.5 volts.

As evidenced by the fact that $I_{OL}$ and $I_{OH}$ can be controlled to be largely equal, resistive element 600 functions to balance the magnitudes of the peak currents conducted to and from the two internal voltage supply lines 311 and 313. Resistive element 600 therefore allows the output driver to supply substantially equal pull-up and pull-down currents and to achieve substantially equal pull-up and pull-down transition times.

Figure 7:
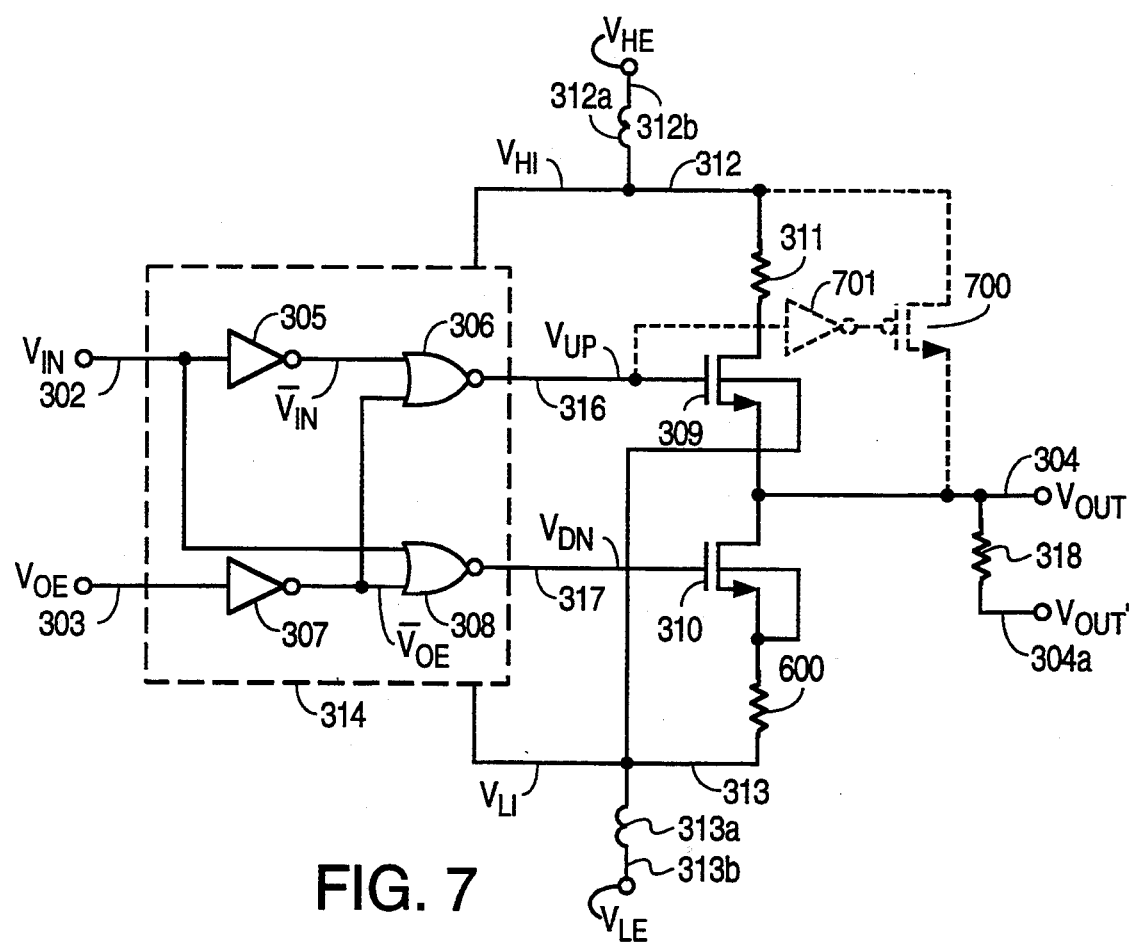
FIG. 7 is a simplified circuit diagram of another embodiment of an output driver in accordance with the invention.

FIG. 7 shows another embodiment of the output driver in accordance with the present invention. The output driver of FIG. 7 is structurally similar to the output driver of FIG. 6 except that the drive control section 314 of FIG. 7 does not contain a charge rate control circuit 315. The voltage on the gate of second output transistor 310 is driven to rise as fast as possible to turn on second output transistor 310 as fast as possible, the resistive element 600 being used to limit dI/dt after second output transistor 310 turns on.

Figure 8:
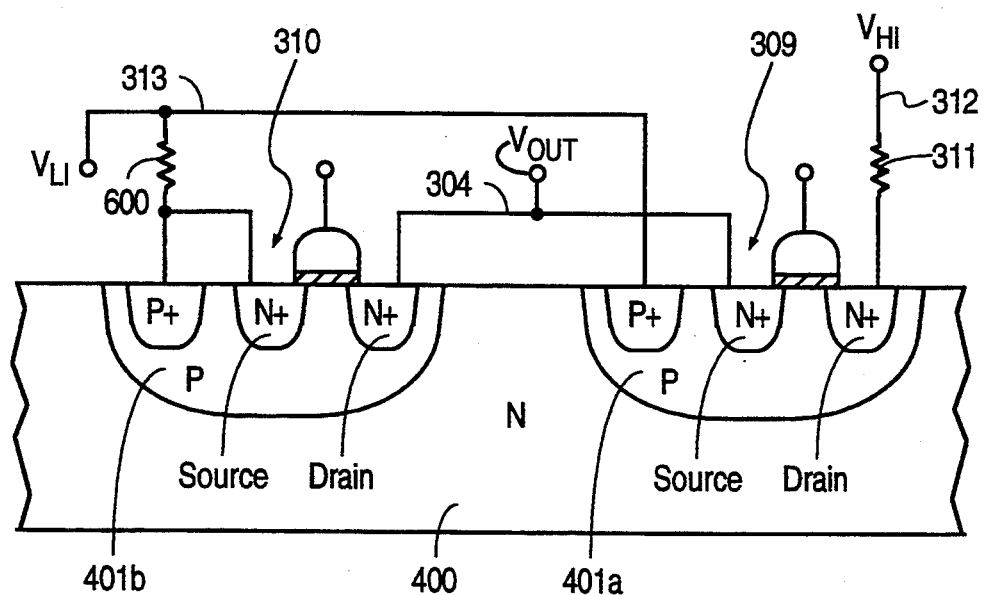
FIG. 8 is an illustrative simplified cross-sectional structural diagram showing part of the output driver of FIG. 7.

FIG. 8 is an illustrative simplified cross-sectional diagram showing part of the output driver of FIG. 7. First and second output transistors 309 and 310 are shown disposed in two different P-wells 401a and 401b, respectively.

Importantly, the addition of resistive element 600 into the output driver of FIG. 7 helps to alleviate ground bounce without causing a decrease in switching speed. A certain maximum dI/dt is tolerable in an output driver. When a group of output drivers are fabricated according to a given manufacturing process, a significant spread in the magnitude of the minimum dI/dt generated by the output drivers circuitry can arise from wafer to wafer, or even from die-to-die across a wafer, due to processing variations which affect field effect transistor performance. To minimize the risk that the dI/dt generated by any one of the drivers will exceed the maximum tolerable dI/dt, the manufacturing specification typically requires that a suitable "safety margin" exist between the maximum tolerable dI/dt and the nominal (i.e., average) dI/dt of all the drivers actually manufactured.

One way to limit the maximum dI/dt generated by the output drivers is to control the speed with which the output transistors 309 and 310 turn on. This, however, may require controlling the electrical characteristics (i.e. threshold voltage $V_t$, saturation current $I_{dsat}$, and gate capacitance) of the transistors on the output driver die. Another way to limit the maximum dI/dt generated by the output drivers is to place resistive element 600 in the current path. This directly limits the maximum dI/dt of the current path. Provision of resistive element 600 is generally advantageous, regardless of whether or not a charge rate control circuit is provided, due to the fact that the resistance of resistive element 600 is generally more easily predicted and controlled over temperature and process variations than are the electrical characteristics of field effect transistors. Accordingly, use of the resistive element to control maximum dI/dt results in a greater percentage of parts produced falling within the "safety margin" than would be the case if transistor characteristics were used to control dI/dt to fall within the "safety margin".

Moreover, the Q of the output circuit formed by an external load capacitance, the inherent inductance of the data output terminal 304, and the drain-to-source resistance of second output transistor 310 is reduced by inclusion of resistance element 600. This reduction in Q cuts the amplification of ground bounce in voltage $V_{LI}$ which appears in the output signal at the load on data output terminal 304. In particular, inclusion of resistive element 600 reduces the Q of the output circuit by a factor of 2 to 4. A typical Q of the output circuit ranges from 1.5 to 2.0. Thus, a reduction in Q by a factor of 2 to 4 significantly reduces ground bounce present on the data output terminal 304. The same propagation delay therefore exists through the output driver circuit but less than one-half of the ground bounce is associated with a non-transitioning data output signal. Furthermore, the addition of resistive element 311 between the drain of first output transistor 309 and the external low voltage supply $V_{HE}$ balances the output driver and therefore facilitates supply-line bounce reduction.

In the preferred embodiment of the output driver circuit of FIG. 7, first resistive element 311 has a resistance of 28 ohms whereas second resistive element 600 has a resistance of 7.5 ohms. Resistive element 318 has a resistance of 100 ohms. The first output transistor 309 has an effective width of 542.5 microns and a length of 1.04 microns whereas the second output transistor 310 has an effective width of 1124.2 microns and a length of 0.82 microns. First and second output transistors 309 and 310 both have a threshold voltage of approximately 0.8 volts.

For a rail to rail output voltage swing, a P-channel pullup transistor 700 and an inverter 701 may be added to pull voltage $V_{OUT}$ up to $V_{HI}$ when $V_{OUT}$ is to be a digital logic level high. The circuit comprising pullup transistor 700 and inverter 701 may also be used in the embodiment of FIGS. 3 and 6 where CMOS output voltage levels are required on the data output terminal 304.

Figure 9:
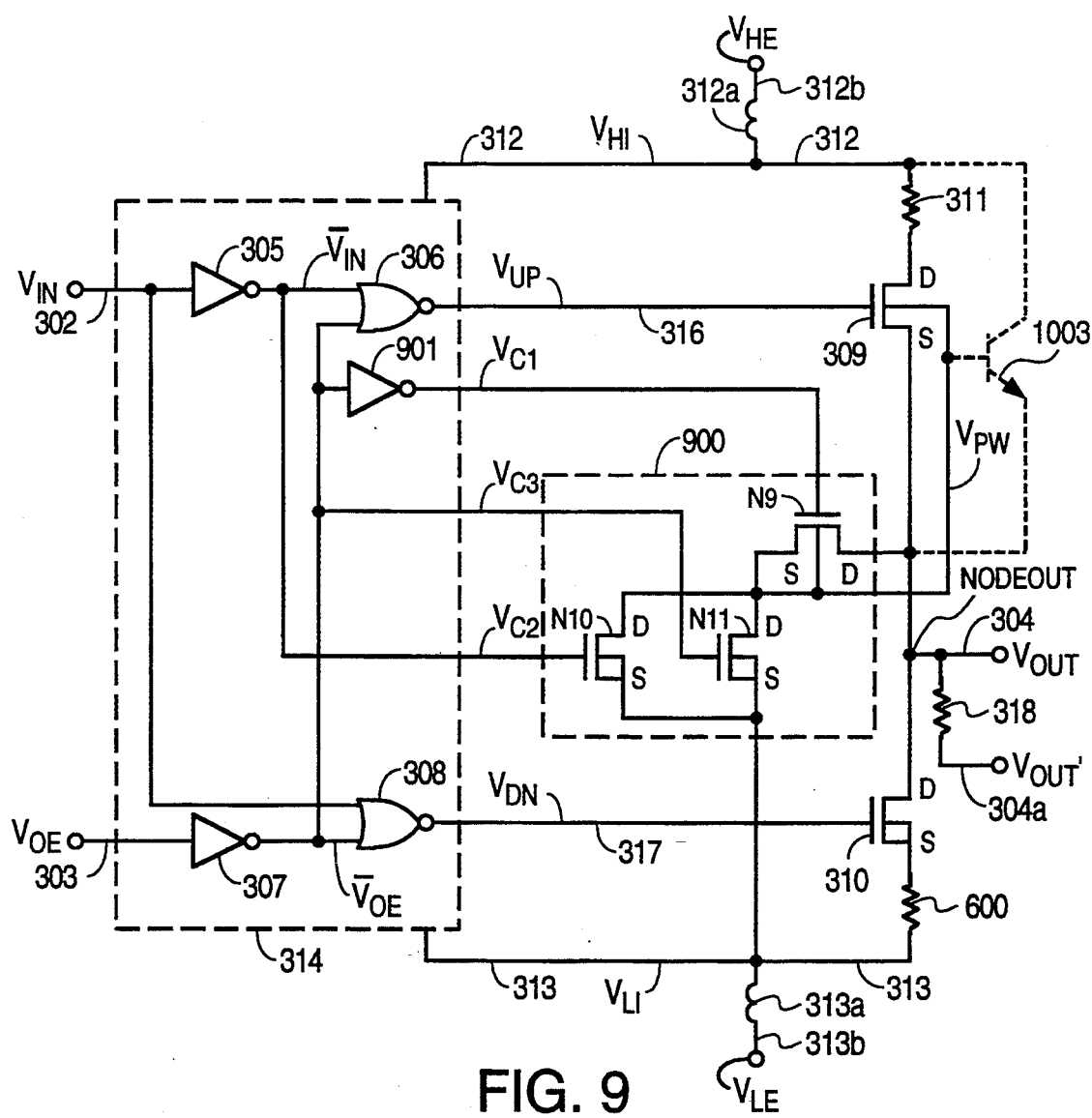
FIG. 9 is a simplified circuit diagram of another embodiment of the output driver in accordance with the invention.

FIG. 9 shows another embodiment of an output driver in accordance with the present invention. The output driver circuit of FIG. 9 is similar to the output driver circuit of FIG. 7 except for the provision of a bulk potential control circuit 900. This output driver is particularly suitable for driving a communications bus, such as a backplane, that requires live insertion capability. The output driver of FIG. 9 is formed on a semiconductor die (not shown) of a packaged integrated circuit (not shown). The die also usually contains a group of output drivers of this type arranged in parallel, one output driver connected to each wire of the bus. As indicated in FIG. 9, power for the die is provided from external high and low supply voltages $V_{HE}$ and $V_{LE}$ to the internal high and low voltage $V_{HI}$ and $V_{LI}$ supply lines.

The output driver of FIG. 9 comprises a CMOS drive control section 314, a first N-channel output field effect transistor 309, a second N-channel output field effect transistor 310, a first resistive element 311, a second resistive element 600, and a bulk potential control circuit 900. As with the drive control section 314 of FIG. 7, the drive control section 314 of FIG. 9 produces drive signals $V_{DN}$ and $V_{UP}$ in response to data input signal $V_{IN}$ and enable/disable input signal $V_{OE}$. The drive control section 314 of FIG. 9, however, also produces control signals $V_{C1}$, $V_{C2}$, and $V_{C3}$. As seen from FIG. 9, control signal $V_{C2}$ is signal $\overline{V}_{IN}$. Similarly, control signal $V_{C3}$ is signal $\overline{V}_{OE}$. The driver control section 314 of FIG. 9 contains a CMOS inverter 901 which generates $V_{C1}$, a slightly delayed version of input signal $V_{OE}$. Inverters 305 and 307 and NOR gates 306 and 308 may be constructed in substantially identical fashion to inverters 305 and 307 and NOR gates 306 and 308 of FIG. 6.

The source region and bulk region of second output transistor 310 is coupled to the internal low voltage $V_{LI}$ supply line 313 via resistive element 600. The drain of second output transistor 310 is coupled directly to data output terminal 304 and directly to the source of first output transistor 309. The drain of first output transistor 309 is coupled to the internal high voltage $V_{HI}$ supply line 312 via resistive element 311. The source and drain of first N-channel output transistor 309 are formed in a main semiconductor bulk region, P-well 401a, which is coupled to an output lead of the bulk potential control circuit 900.

Bulk potential control circuit 900 comprises three enhancement-mode N-channel insulated-gate switching transistors N9, N10, and N11. Voltage $V_{C1}$ is supplied to the gate of transistor N9. The channel of transistor N9 is connected between NODEOUT and the semiconductor bulk region 401a containing first output transistor 309. The bulk region of transistor N9 is also coupled to the bulk region 401a of first output transistor 309. In some embodiments, transistor N9 and first output transistor 309 are formed in the same P-well region. Voltage $V_{C2}$ is supplied to the gate of transistor N10. The channel of transistor N10 is connected between the semiconductor bulk region 401a containing first output transistor 309 and internal low voltage $V_{LI}$ supply line 313. Voltage $V_{C3}$ is supplied to the gate of transistor N11. Like the channel of transistor N10, the channel of transistor N11 is connected between the semiconductor bulk region 401a containing first output transistor 309 and internal low voltage $V_{LI}$ supply line 313. The bulk regions of both transistors N10 and N11 are connected to internal low voltage $V_{LI}$ supply line 313.

Figure 10A:
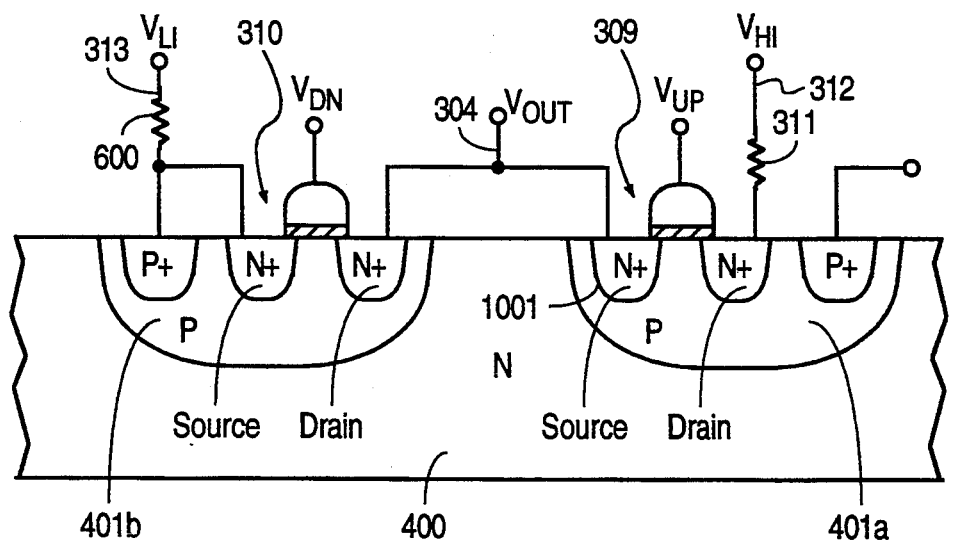
FIGS. 10a and 10b are illustrative simplified cross-sectional structural diagrams showing part of the output driver of FIG. 9.
Figure 10B:
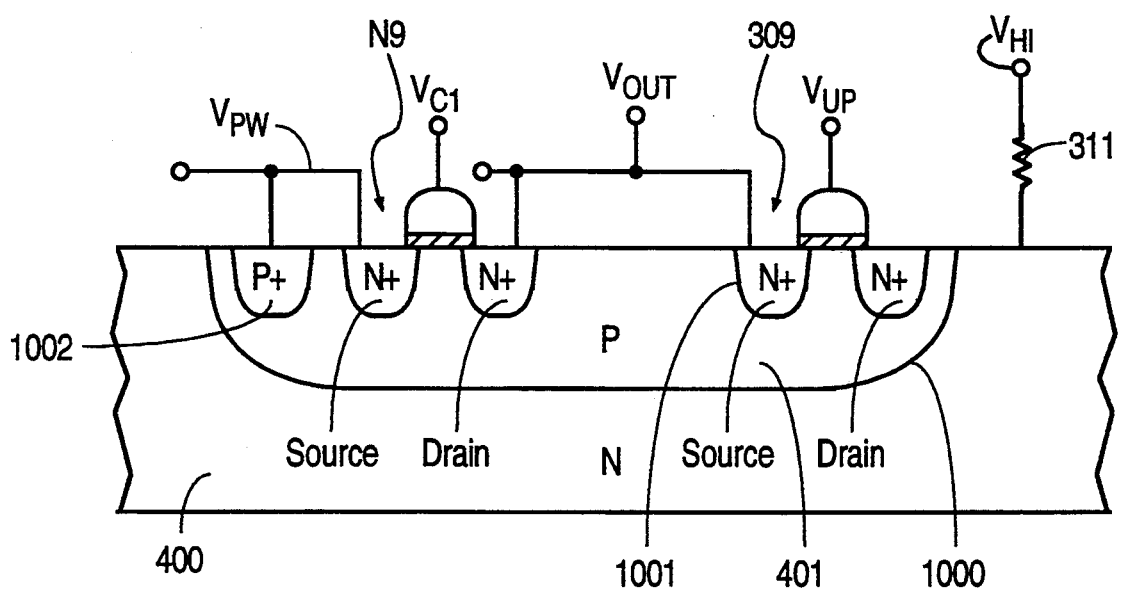

FIG. 10a shows in cross-section the basic physical structure of first and second output transistors 309 and 310 in the embodiment of FIG. 9. As shown in FIG. 10a, the output driver of FIG. 9 is fabricated on an N-type monocrystalline silicon semiconductor substrate 400. The source and drain regions of first output transistor 309 are formed in a P-well region 401a whereas the source and drain regions of second output transistor 310 are formed in another P-well region 401b. Accordingly, the bulk region for transistor 309 is P-well 401a and the bulk region for transistor 310 is P-well 401b. FIG. 10b shows in cross-section the basic physical structure of transistor N9 and first output transistor 309 disposed in a single P-well 401a. The voltage of P-well 401a is controlled to be voltage $V_{PW}$ via P+ contact region 1002 which establishes a contact to P-well 401a.

The output driver of FIG. 9 operates as follows. When the output driver is powered, driver control section 314 controls control signals $V_{UP}$ and $V_{DN}$ to control first and second output transistors 309 and 310 in the same way, described above, that driver control section 314 controls $V_{UP}$ and $V_{DN}$ in the embodiment of FIG. 7. If signal $V_{OE}$ is high at its enabling value, then input signal $V_{IN}$ controls output transistors 309 and 310 in such a manner that one is off when the other is on depending on the value of signal $V_{IN}$. If, on the other hand, signal $V_{OE}$ is low at its disabling value, then the data output terminal 304 of the output driver is in a tri-state mode with first and second output transistors 309 and 310 both off.

The driver control section 314 of FIG. 9, however, also controls bulk potential control circuit 900 by suitably activating/deactivating transistors N9, N10 and N11 with control voltages $V_{C1}$, $V_{C2}$ and $V_{C3}$ so that the voltage of P-well 401a: 1) has a high voltage when the output driver is powered and enabled to drive the data output terminal 304 with a high digital logic voltage level, 2) has a low voltage when the output driver is powered and enabled to drive the data output terminal 304 with a low digital logic voltage level, 3) has a low voltage when the output driver is powered and disabled, and 4) floats, decoupled from both internal voltage supply lines 312 and 313 and from the data output terminal 304, when the output driver is not powered.

The table below summarizes the operation of the driver control section 314 in dynamically controlling voltage $V_{PW}$, the voltage of the P-well 401a in which first transistor 309 is disposed:

| Operational Truth Table | | | | | | | | |
|---|---|---|---|---|---|---|---|---|
| Power | $V_{OE}$ | $V_{IN}$ | N9 | N10 | N11 | 310 | 309 | $V_{OUT}$ | $V_{PW}$ |
| On | H | H | On | Off | Off | Off | On | H | H |
| On | H | L | On | On | Off | On | Off | L | L |
| On | L | H | Off | Off | On | Off | Off | Z | $V_{LE}$ |
| On | L | L | Off | On | On | Off | Off | Z | $V_{LE}$ |
| Off | DC | DC | Off | Off | Off | Off | Off | Z | Float |

In this table, "H" and "L" respectively denote digital logic level high and low levels. "DC" denotes a "don't care" condition. "Z" denotes that data output terminal 304 is to be in a tri-state mode. N-type substrate 400 is permanently connected to voltage supply line $V_{HE}$ at all times.

If $V_{OE}$ is high, if the output driver is powered, and if data input signal $V_{IN}$ is being driven high so that data output signal $V_{OUT}$ is high, then conductive transistor N9 causes P-well 401a to be coupled to the high voltage on data output terminal 304. Transistor N10 is controlled to be non-conductive by $V_{C2}$ being low when $V_{IN}$ is high. Transistor N11 is non-conductive when $V_{OE}$ is high. P-well 401a therefore assumes a high voltage. This situation corresponds with the first row in the above table.

For a load operating at TTL levels, $V_{PW}$ reaches the high value of $V_{OUT}$. For a load operating at CMOS levels, $V_{PW}$ reaches $V_{HE} - V_{TN9}$, where $V_{TN9}$ is the threshold voltage of transistor N9. In either case, the PN junction 1000 does not become forward biased because the high value of $V_{PW}$ cannot be greater than high voltage supply $V_{HE}$ to which substrate 400 is permanently connected. Maintaining voltage $V_{PW}$ high when first transistor 309 is on enables $V_{OH}$ of the output driver voltage $V_{OUT}$ to reach a higher voltage level for a load running at TTL levels. Dynamically controlling the voltage of P-well 401a serves to increase $V_{OH}$ 0.3–0.6 volt.

If $V_{OE}$ is high, if the output driver is powered, and if data input signal $V_{IN}$ is being driven low so that data output signal $V_{OUT}$ is low, then conductive transistor N9 causes P-well 401a to be coupled to the low voltage on data output terminal 304. Moreover, transistor N10 will also be conductive to couple the P-well 401a to internal low voltage $V_{LI}$ supply line 313. P-well 401a therefore assumes a low voltage. This situation corresponds with the second row of the above table. PN junction 1000 is not forward biased because the low voltage on P-type well 401a is less than the high voltage $V_{HE}$ on N-type substrate 400.

There is another PN junction, PN junction 1001, in the embodiment of FIG. 9 that is controlled not to become forward biased. If PN junction 1001 were to become forward biased, the base-emitter junction of a parasitic bipolar transistor 1003 may be turned on resulting in latch up of the CMOS circuit. The emitter of this parasitic bipolar transistor may, for example, be the source of first output transistor 309, the base may be P-well 401a, and the collector may be the N-type substrate 400. In the present invention, this PN junction 1001 does not become forward biased because the low voltage on P-type well 401a is not greater than the low voltage on the N+ source region of first output transistor 309. When the voltage $V_{OUT}$ on data output terminal 304 transitions high-to-low, the voltage on P-well 401a must have already dropped from a high voltage to a low voltage. If P-well 401a remains at a high voltage during the high-to-low transition of data output terminal 304, PN junction 1001 will become forward biased leading to latchup. To avoid this situation, the N10 and N11 transistors are sized to be large enough so that they will discharge the 2pF P-well 401a capacitance to ground at 5.0 Volt/nsec before first output transistor 304 turns off and before the second output transistor 310 turns on. To insure that the voltage of P-well 401a is low before $V_{OUT}$ goes low, one pulldown transistor N10 is used for the situation in which $V_{OUT}$ is being forced low by $V_{IN}$, another pulldown transistor N11 is used for the situation in which $V_{OUT}$ is forced low by external circuitry due to the output terminal 304 being tristated by $V_{OE}$. Pulldown transistors N10 and N11 are controlled by signals $\overline{V}_{IN}$ and $\overline{V}_{OE}$, respectively, which transition earlier than voltages $V_{UP}$ and $V_{DN}$ transition. The voltage of P-well 401a is therefore pulled low before the output transistors switch to pull the data output terminal 304 low.

In some embodiments, the source-to-drain on-resistance of transistor N9 is made sufficiently low such that transistor N10 is not required. In these embodiments, the source-to-drain on-resistance of transistor N9 is sufficiently low to insure that the voltage drop across transistor N9 is not great enough to forward bias the base-to-emitter junction 1001 of parasitic transistor 1003 when voltage $V_{OUT}$ transitions high-to-low pulling P-well 401a low through the source-to-drain on-resistance of transistor N9.

If $V_{OE}$ is low, and if the output driver is powered, then transistor N9 is made non-conductive by signal $V_{C1}$ and transistor N11 is made conductive by signal $V_{C3}$. P-well 401a is therefore coupled to internal low voltage $V_{LI}$ supply line 313 and P-well 401a assumes the low voltage of $V_{LE}$. If the data input signal $V_{IN}$ is low, then transistor N10 is also made conductive between P-well 401a and the internal low voltage $V_{LI}$ supply line 313. This situation corresponds with the fourth row of the above table. If, on the other hand, the data input signal $V_{IN}$ is high, then transistor N10 is non-conductive. P-well 401a, however, still assumes a low voltage due to transistor N11 being on. This situation corresponds with the third row of the above table.

During unpowered output driver operation, P-well 401a voltage $V_{PW}$ floats because the driver control section 314 is unpowered and cannot control any of transistors N9, N10 and N11 to be on. If the data output terminal 304 of the output driver is now placed in electrical contact with a live communications bus wire, such as a bus wire on a printed circuit board backplane, the voltage $V_{PW}$ at which P-well 401a floats is not sufficiently high to cause PN junction 1000 to become forward biased prior to the time that output driver power is turned on to raise the voltage of N-type substrate 400. The output driver is thus suitable in applications where live insertion would otherwise be a problem.

Figure 11:
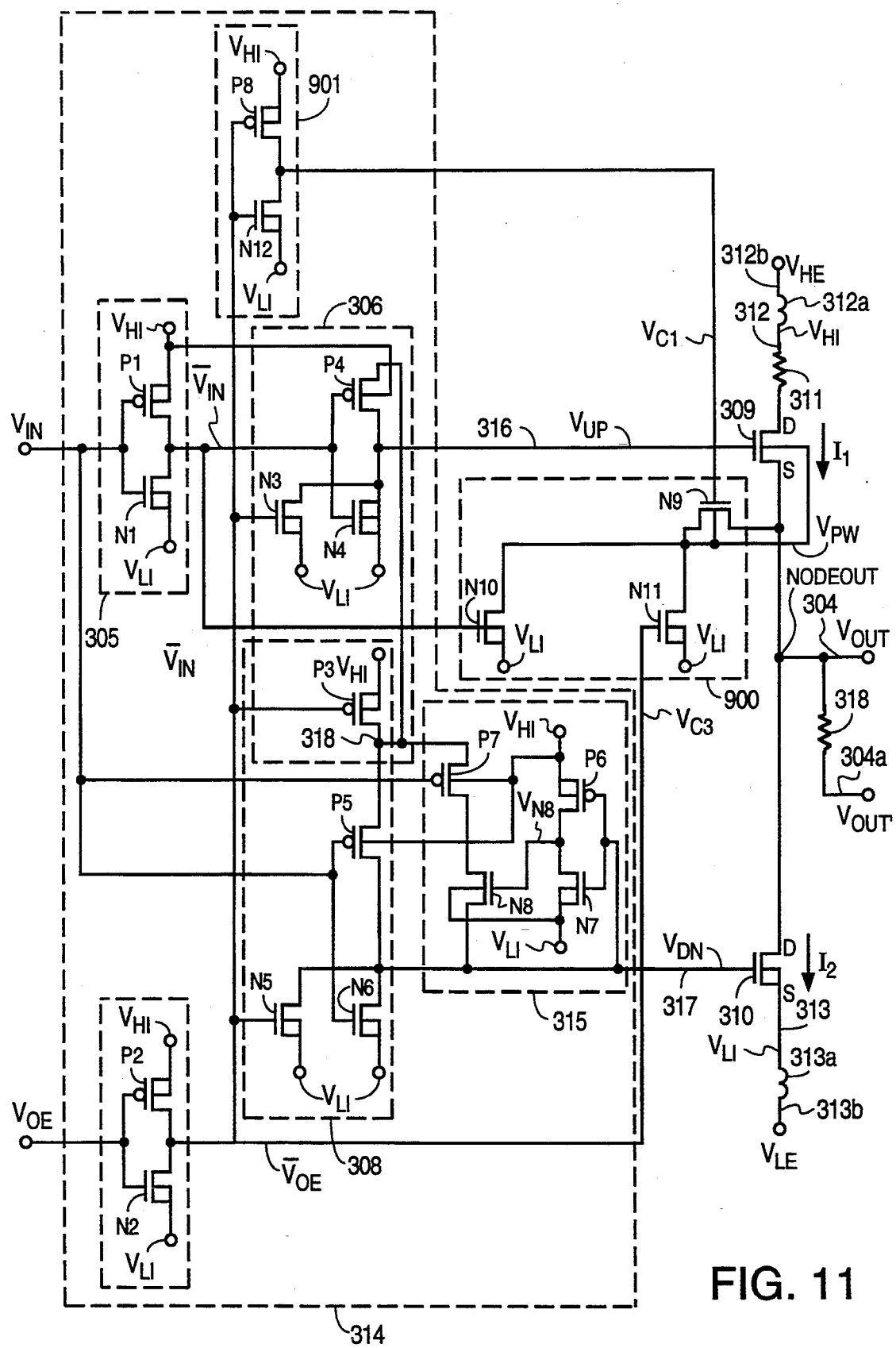
FIG. 11 is a circuit diagram of another embodiment of the output driver in accordance with the invention.
Figure 12:
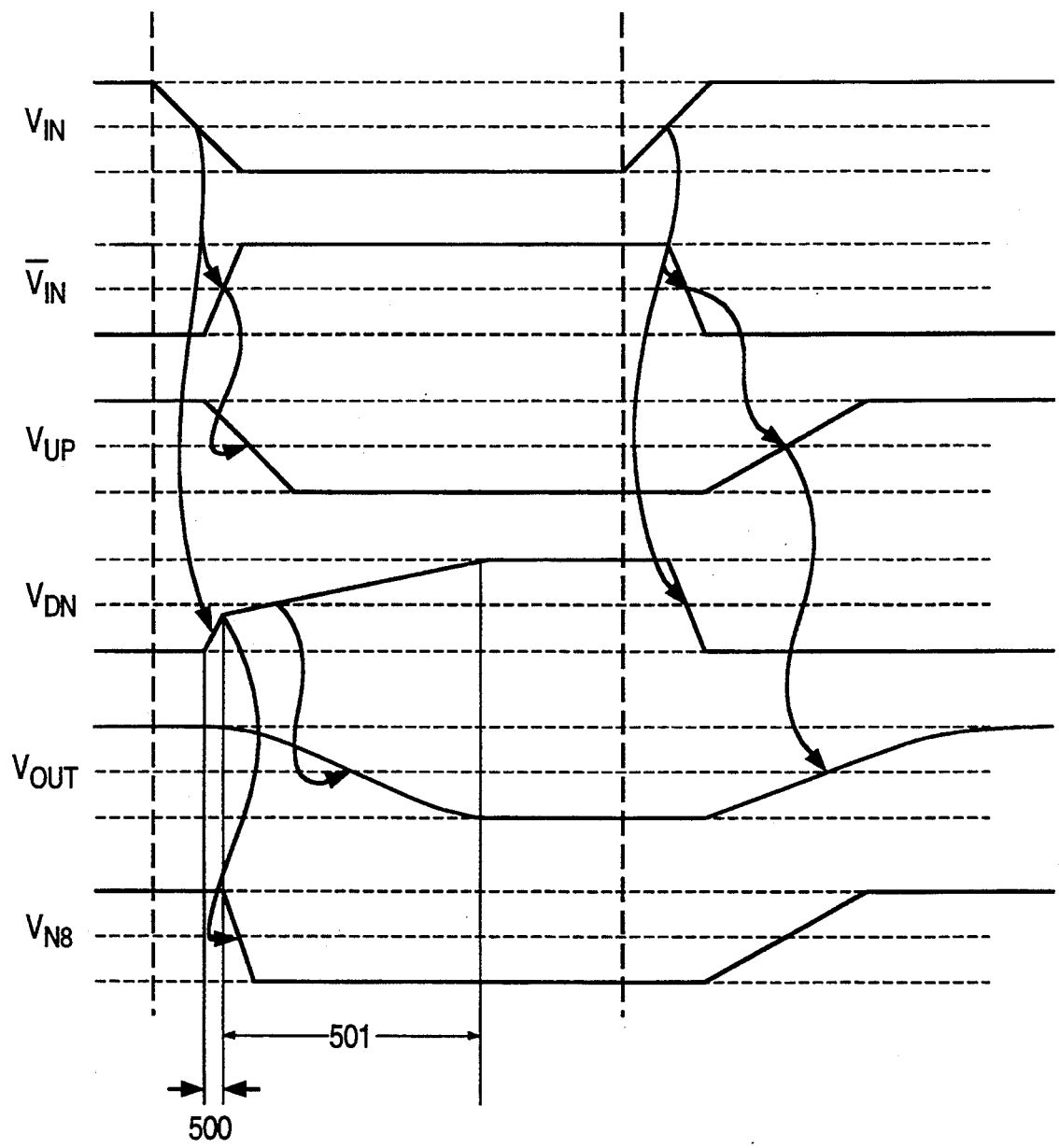
FIG. 12 is a waveform diagram which illustrates operation of the present invention.

FIG. 11 illustrates another embodiment in accordance with the present invention. This embodiment is similar to the embodiment of FIG. 3 except for the incorporation of a bulk potential control circuit 900 and the connection of the bulk regions of first and second output transistors 309 and 310. CMOS inverters 305 and 307, CMOS NOR gates 306 and 308, and charge rate control circuit 315 are configured in similar fashion to the inverters 305 and 307, NOR gates 306 and 308, and charge rate control circuit 315 in FIG. 3. The bulk region of second output transistor 310 is not coupled to the bulk region of first output transistor 309 but rather is coupled to internal low voltage $V_{LI}$ supply line 313. The voltage of the bulk region (P-well 401a) of first output transistor 309 can therefore be controlled by the bulk potential control circuit 900 to which it is coupled. The bulk potential control circuit 900 operates with the drive control circuit 314 to control the voltage $V_{PW}$ on the P-well 401a in similar fashion to the embodiment shown in FIG. 9. Inverter 901 of FIG. 11 operates in similar fashion to inverter 901 of FIG. 9. Accordingly, the embodiment of FIG. 11 is seen to incorporate the charge rate control of the gate of the second output transistor as well as the bulk potential control of the first output transistor into one output driver structure. FIG. 12 is a waveform diagram which illustrates the operation of the present invention.

In a preferred embodiment of the circuit of FIG. 11, the length to width ratios of first and second output transistors 309 and 310 are 542.5/1.04 and 1124.2/.82, respectively. The effective resistance of resistive element 311 is 23 ohms. For a TTL-level load, the output driver of FIG. 11 supplies an $I_{OH}$ of −15 mA at the minimum $V_{OH}$ of 2.4 volts. The output driver of FIG. 11 supplies an $I_{OL}$ of 64 mA at the maximum $V_{OL}$ of 0.5 Volts. The length to width ratios of transistors P3, P5, P7 and N8 are 64/.8, 12/.8, 16/.8, and 24/.8 respectively. The effective length to width ratios of transistors N9, N10 and N11 are 108.4/1.02, 32/.8, and 32/.8, respectively. The maximum rate of change of $I_1$ passing through first output transistor 309 is $10^8$ amps/sec. The maximum rate of change of $I_2$ passing through second output transistor 310 is $10^8$ amps/sec.

In some embodiments, inverter 307 is not provided. Inverter 307 is not required for the logic operation of the output driver but rather is added in some embodiments to reduce the load on the circuitry providing $V_{OE}$.

In some embodiments, the output drivers of FIGS. 3, 6, 7, 9 and 11 are all fabricated on a single basic integrated die substrate pattern. The one of the output driver embodiments which is to be realized is implemented on the die by suitably modifying a layer of metal interconnect which is disposed on the substrate pattern. Resistors may be removed from the circuit being realized by shorting with metal interconnect. Metal connections to the gates and from the source or drains of various transistors can be omitted and the gates connected either to ground or to a digital high voltage to disconnect the various transistors from the circuit being realized. Fabricating the output drivers of FIGS. 6, 7, 9 and 11 in this fashion is quite economical. Any combination of the three aspects of the invention (i.e., the charge rate control aspect, the provision of the second resistive element, and the bulk potential control aspect) can be realized in an economical fashion with only one mask change.

Figure 13A:
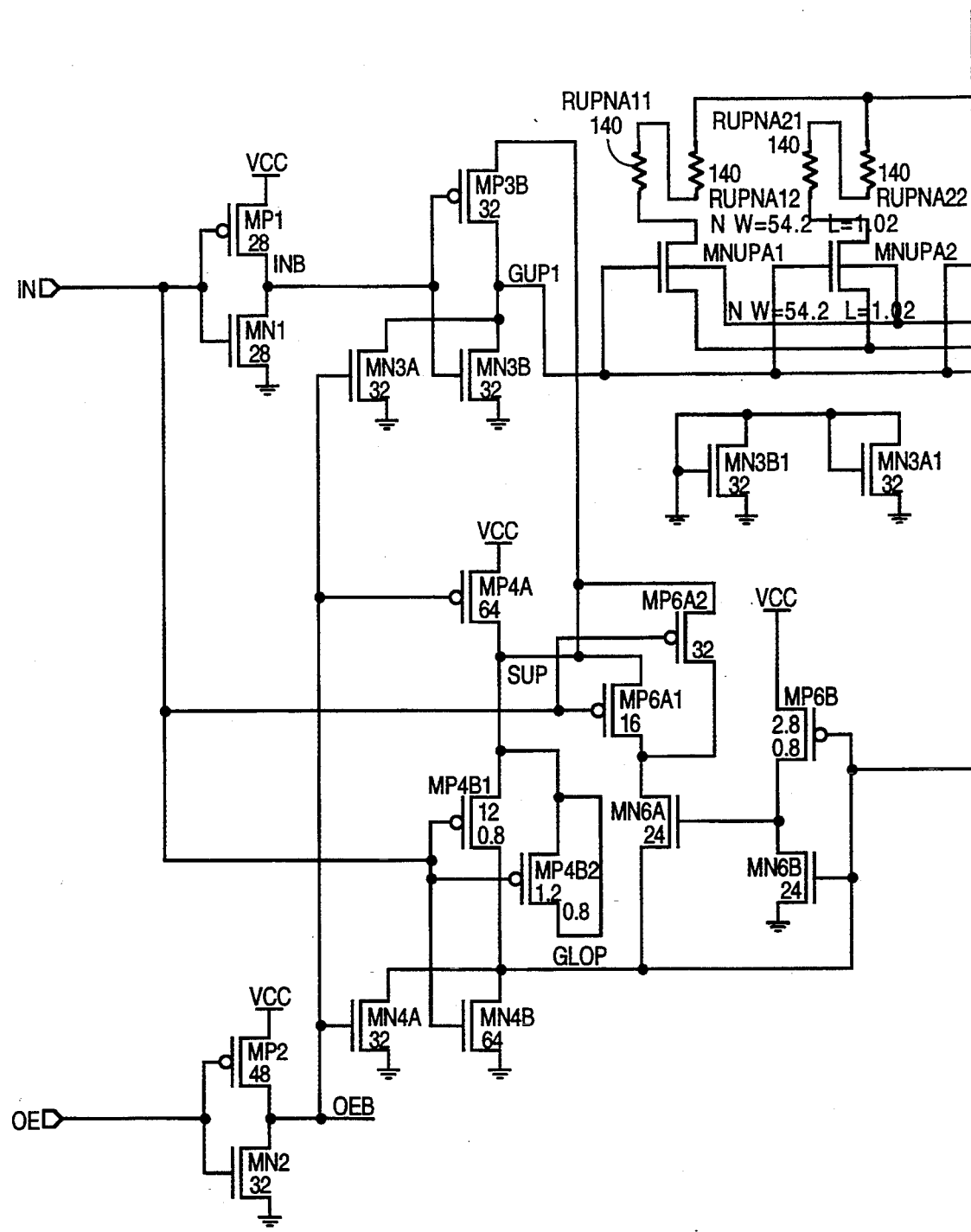
FIGS. 13–21 are schematic illustrations of structures that can be realized using a programmable metal interconnect layer in accordance with the present invention.
Figure 13B:
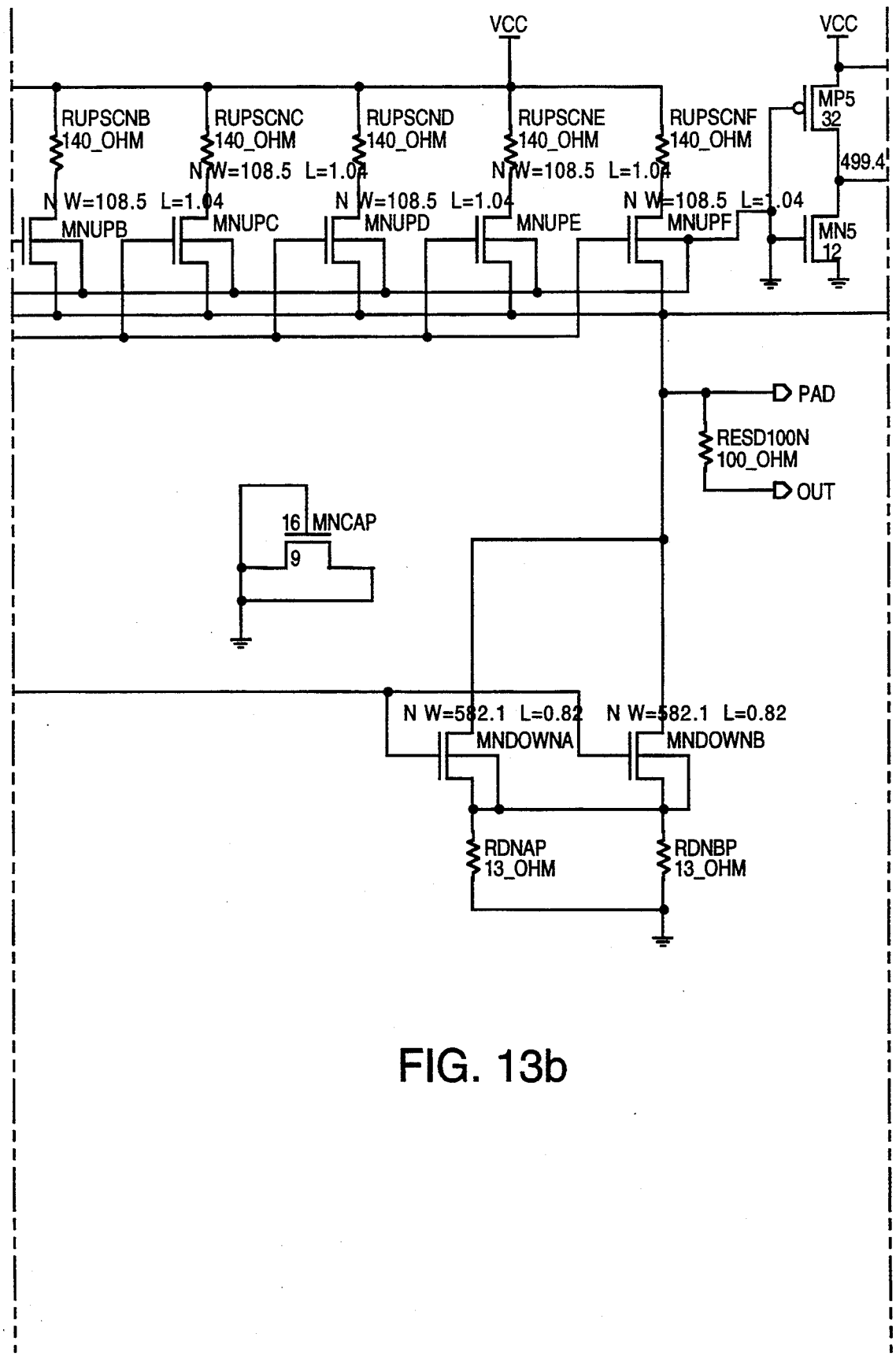
Figure 13C:
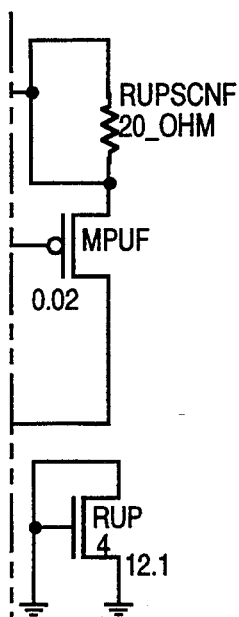

FIGS. 13–21 are examples of structures that can be realized using a programmable metal interconnect layer in accordance with the present invention. In FIG. 13, P-channel transistor MP6A2 is added in parallel with P-channel transistor MP6A1 to change the strength of the pullup P-channel transistor MP6AX in the charge rate control circuit. The second output transistor is realized with two N-channel transistors MNDOWNA and MNDOWNB connected in parallel with each other. The resistive element connected between the source of the second output transistor and the internal low voltage supply line is realized as two 13 ohm resistors RDNAP and RDNBP connected in parallel with each other. The first output transistor is realized as seven N-channel transistors MNUPA1, MNUPA2, MNUPB, MNUPC, MNUPD, MNUPE and MNUPF. The gates of these transistors are connected together and the sources of these transistors are connected together. The drains of each of these transistors goes to a separate resistor, one end of which is connected to the transistor drain, the other end of which is connected to the internal high supply voltage supply line VCC. P-channel transistor MP5 and N-channel transistor MN5 are configured as an inverter, the output of which is connected to P-channel transistor MPUP. Transistors MP5, MN5 and MPUP together comprise an electrostatic discharge protection circuit.

Figure 14A:
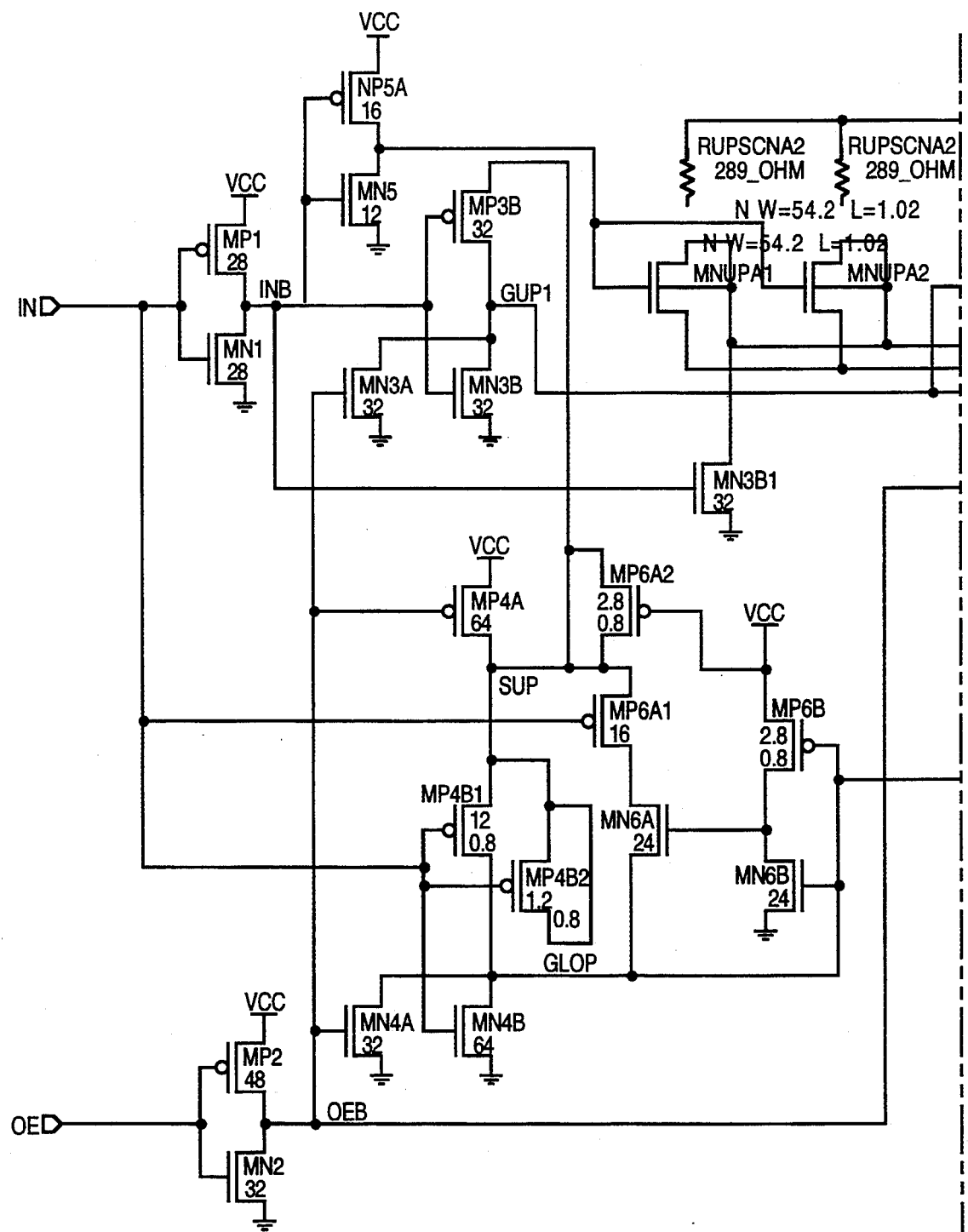
Figure 14B:
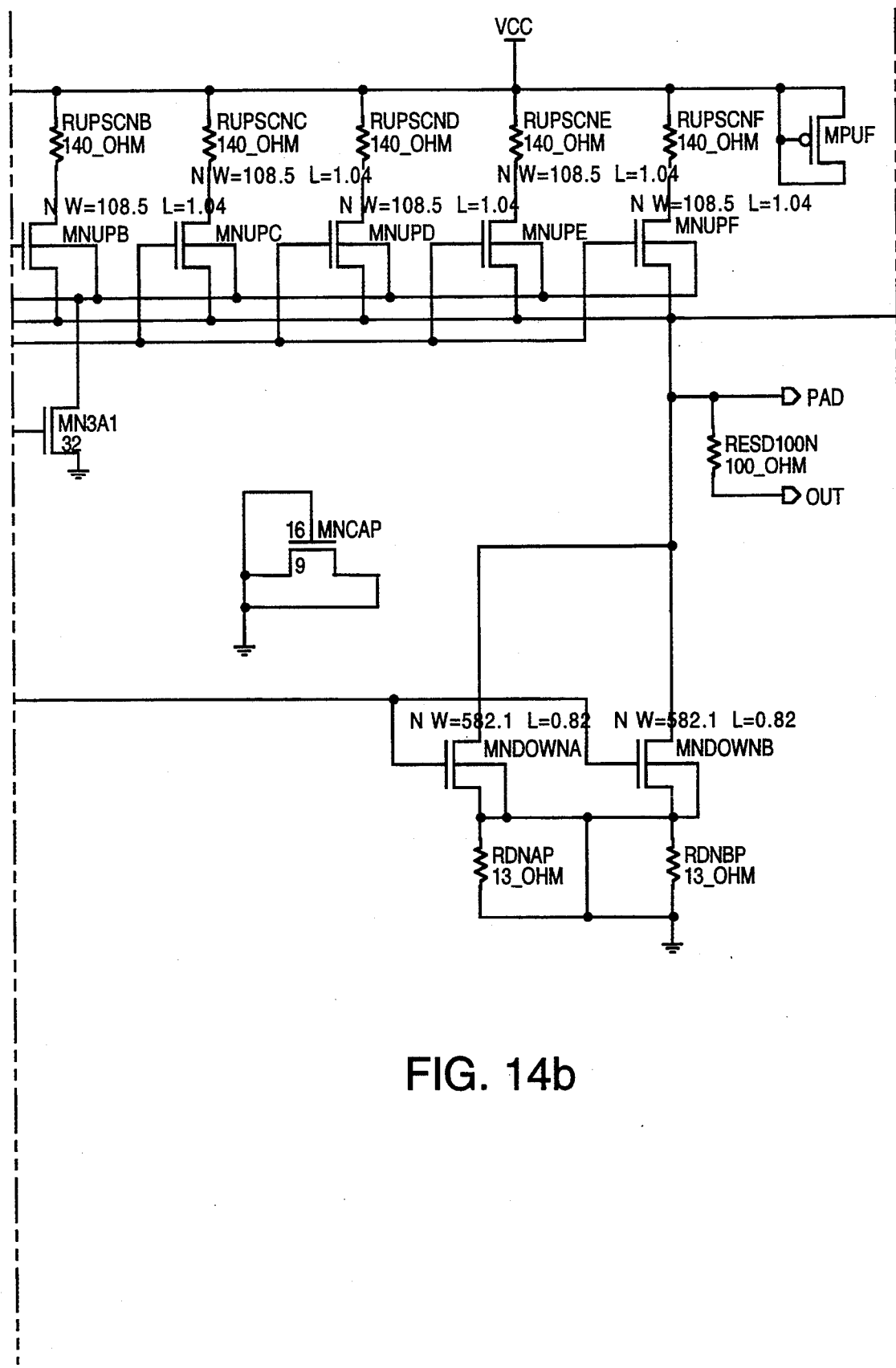
Figure 15A:
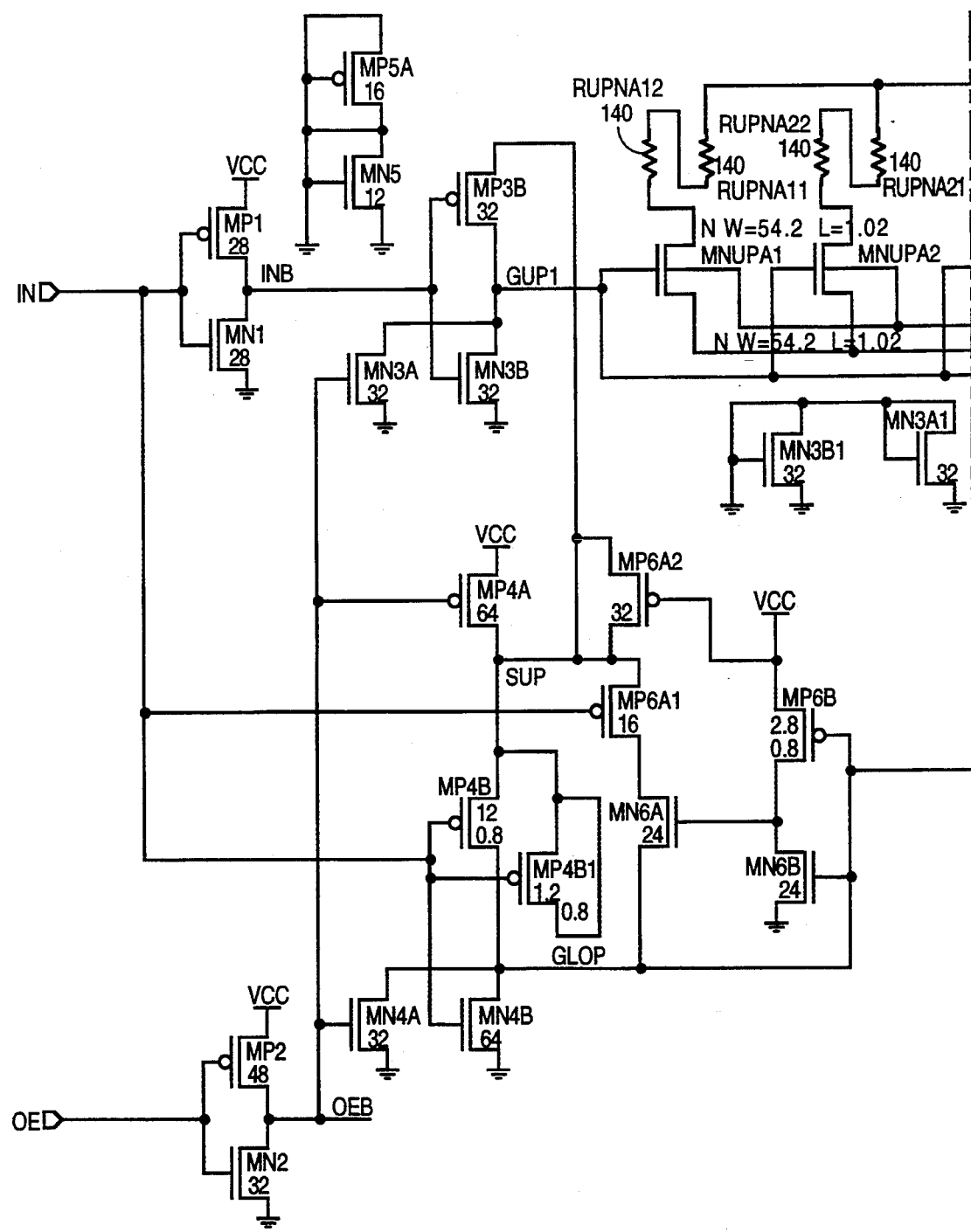
Figure 15B:
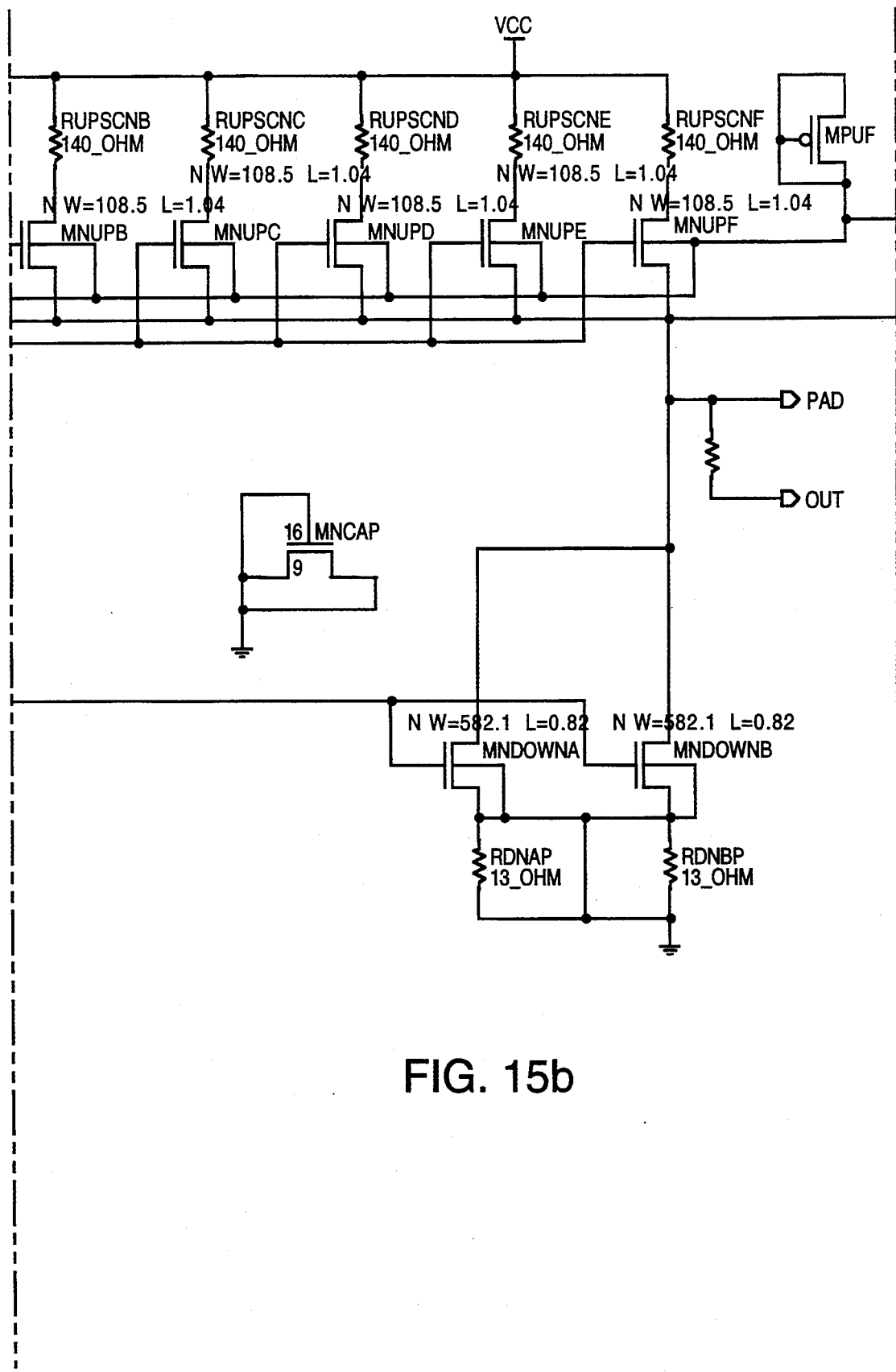
Figure 15C:
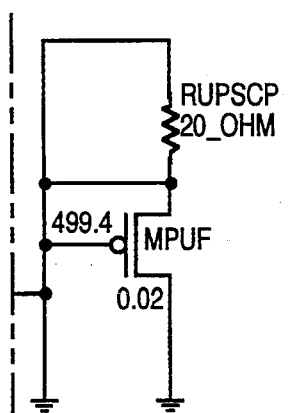
Figure 15C:
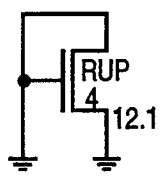

FIG. 14 shows a structure having a dynamically biased well. This structure corresponds with the embodiment of FIG. 11. N-channel transistors MNUPA1 and MNUPA2 correspond with N-channel transistor N9 in FIG. 11. N-channel transistor MN3B1 corresponds with transistor N10 in FIG. 11. N-channel transistor MN3A1 corresponds with transistor N11 in FIG. 11. The resistive element comprising 13 ohm resistors RDNAP and RDNBP are shorted with metallization so that they are effectively removed from the driver circuit. Resistors RUPSCNA1 and RUPSCNA2 are disconnected from N-channel transistors MNUPA1 and MNUPA2 in this structure. P-channel transistor MP6A2 is also unused in this structure.

The backplane driver structure of FIG. 15 corresponds with the embodiment of FIG. 3.

Figure 16A:
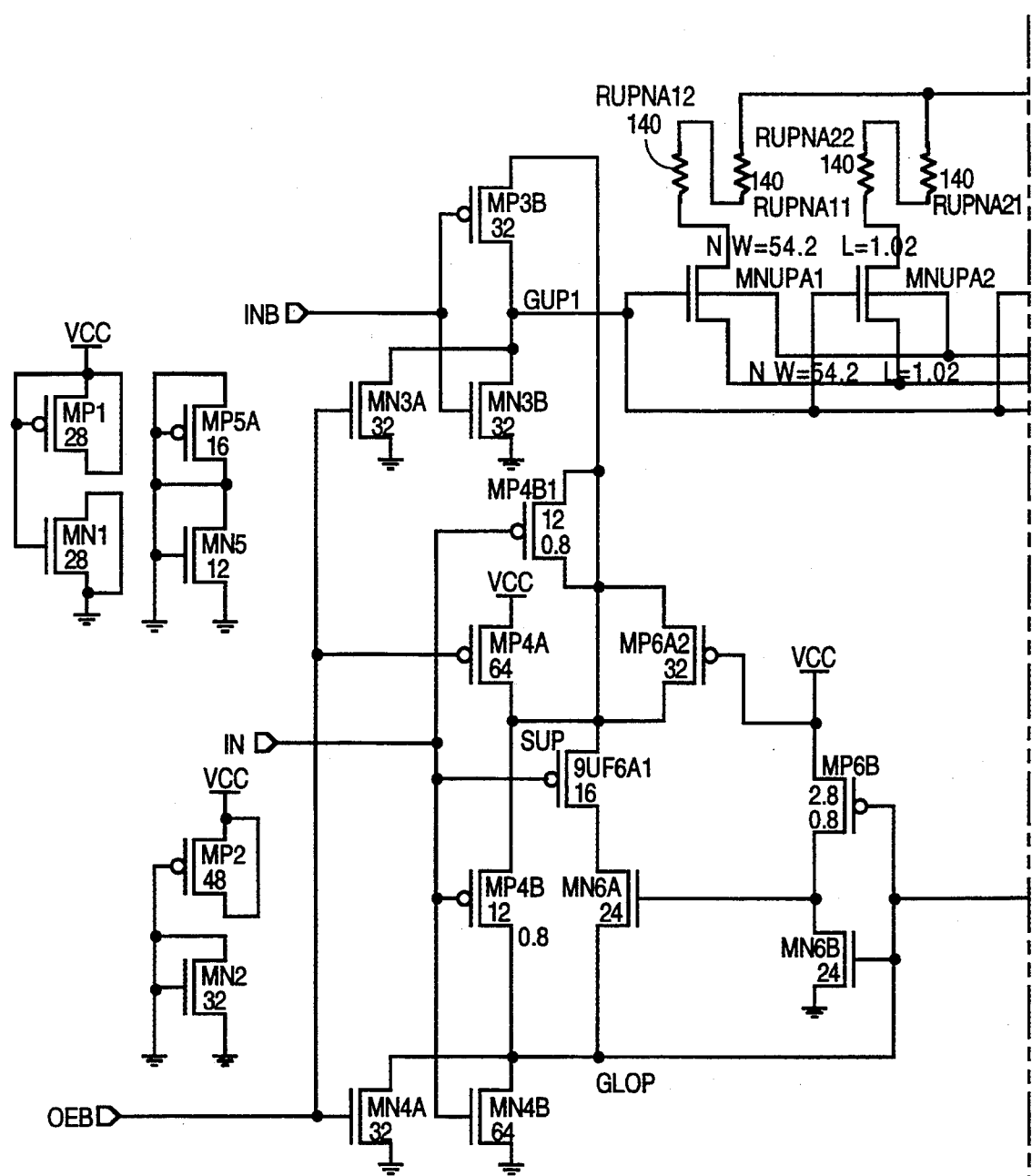
Figure 16B:
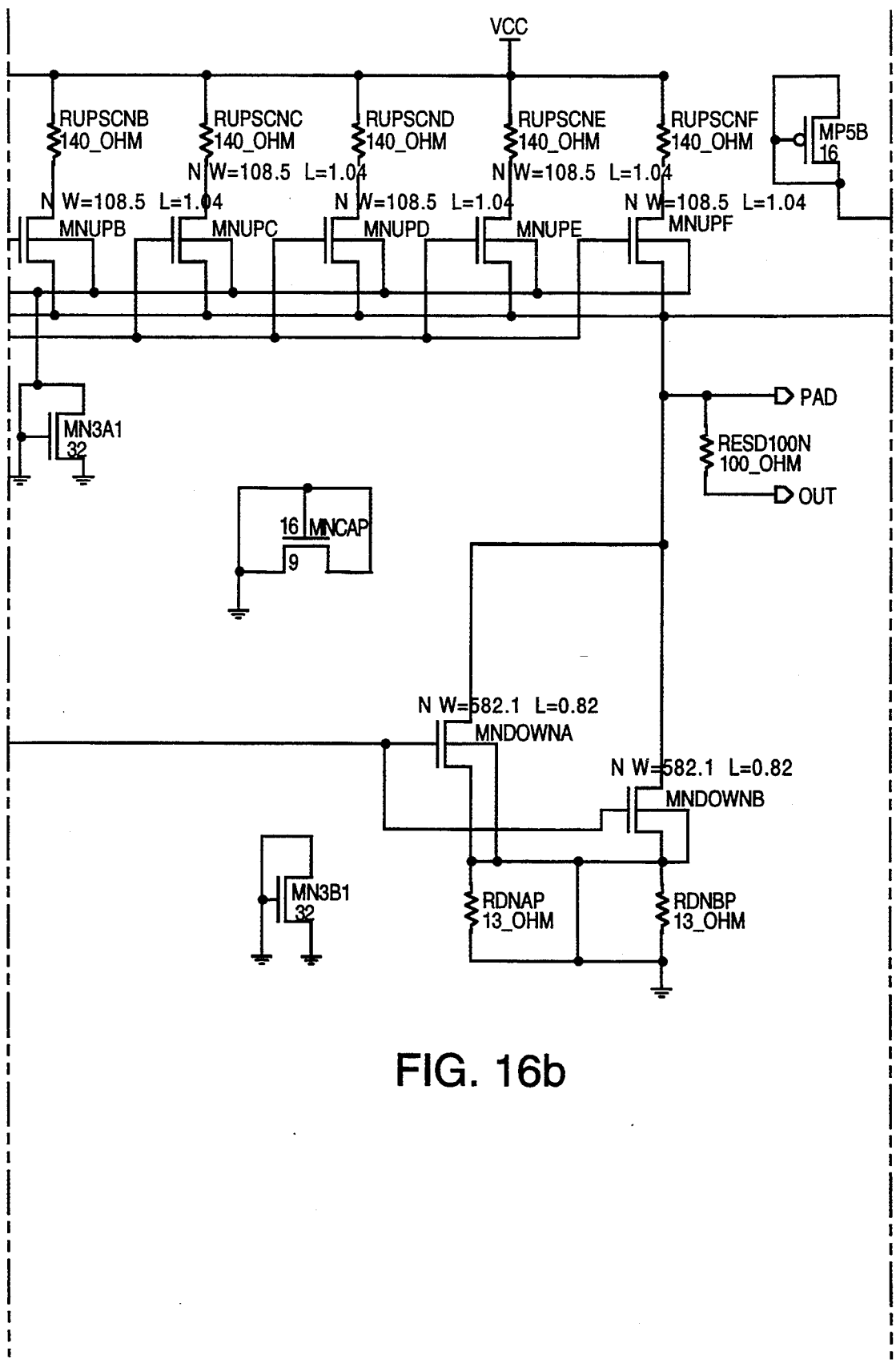
Figure 16C:
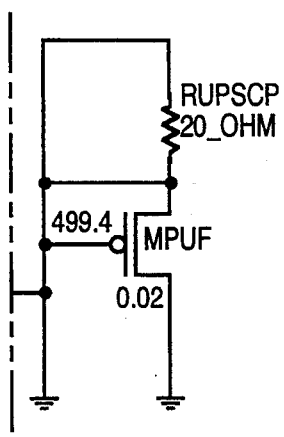
Figure 16:
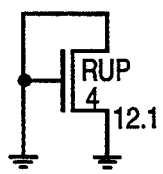

The structure of FIG. 16 corresponds with the embodiment of FIG. 3. This structure has inverters 305 and 307 of FIG. 3 disconnected.

Figure 17A:
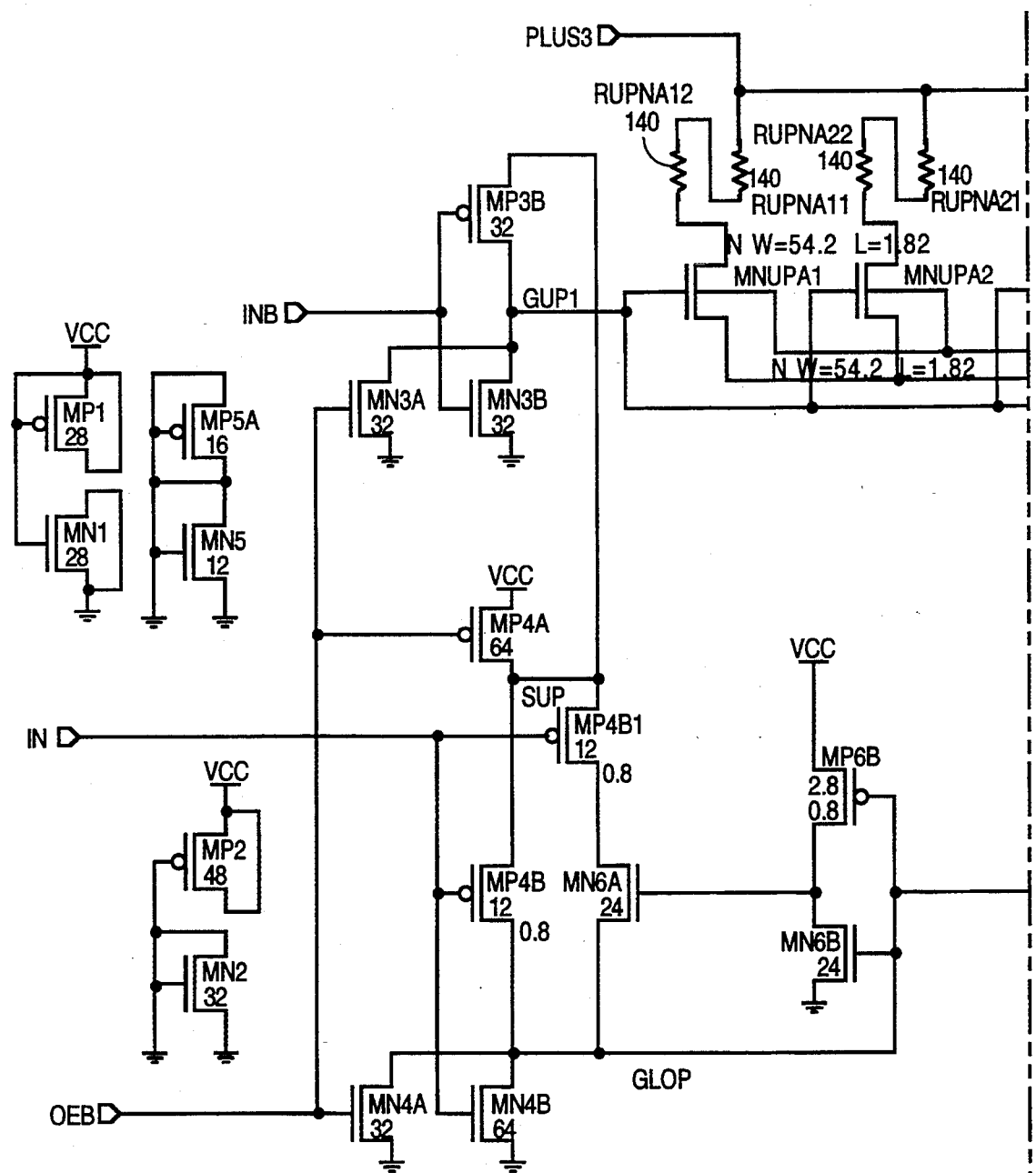
Figure 17B:
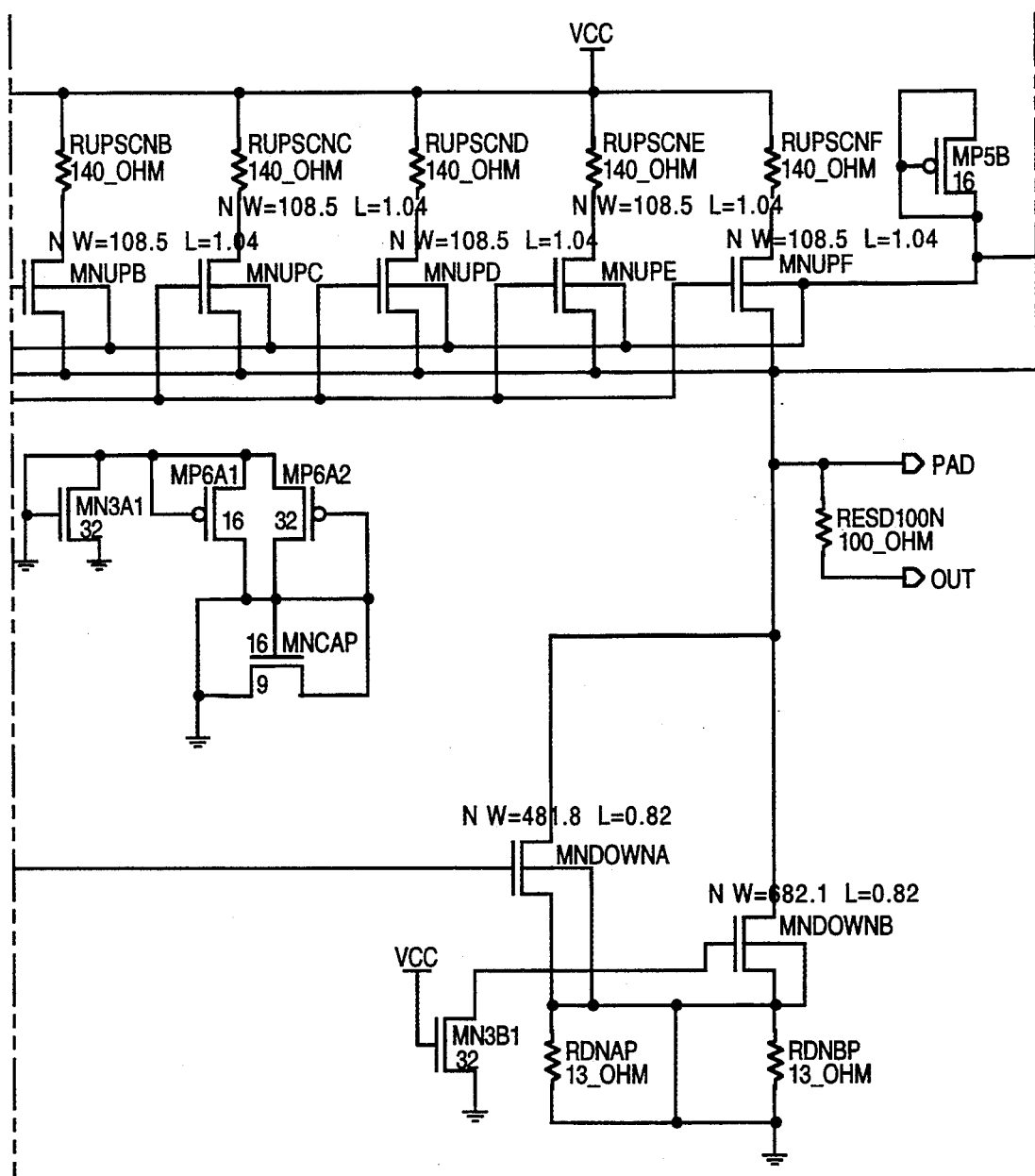
Figures 17, 17C:
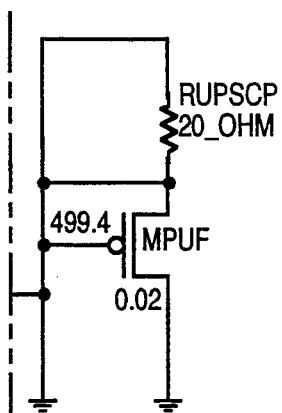

The structure of FIG. 17 corresponds with the embodiment of FIG. 3. The structure of FIG. 17 has the first output transistor connected to a separate power supply labeled PLUS3, whereas the structure of FIG. 16 has the first output transistor connected through a resistive element to VCC. In the structure of FIG. 17, 4/7ths of the second output transistor is disconnected. MNDOWNA and MNDOWNB are constructed of seven segments total, three being used as active devices only and four being used for electrostatic discharge protection only. The structures of FIGS. 16 and 17 are mixed 5 volt 3.3 volt supply drivers.

Figure 18A:
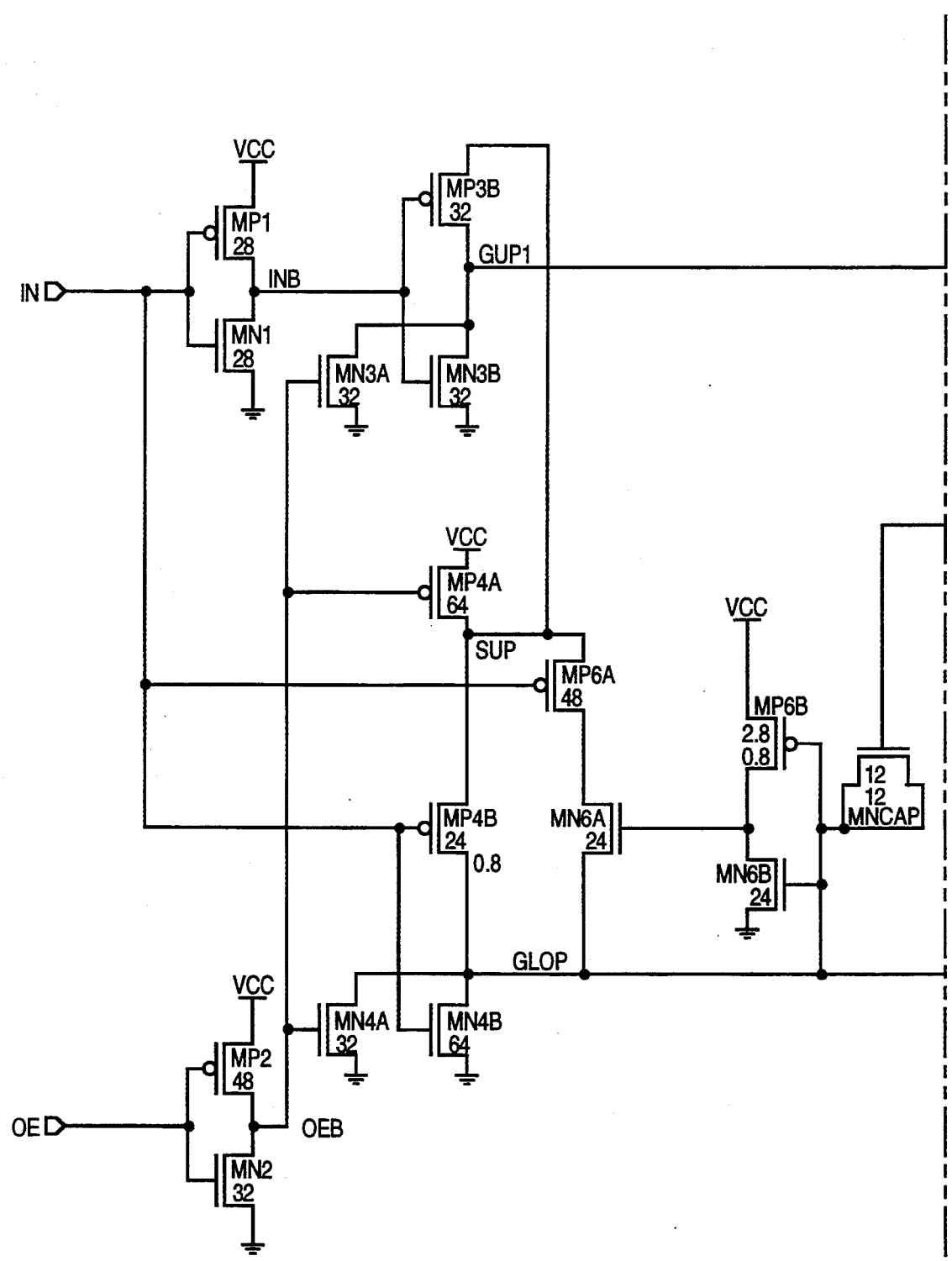

The structure of FIG. 18 is used in non-backplane applications in which the capability of handling live insertion is unnecessary.

Figure 19A:
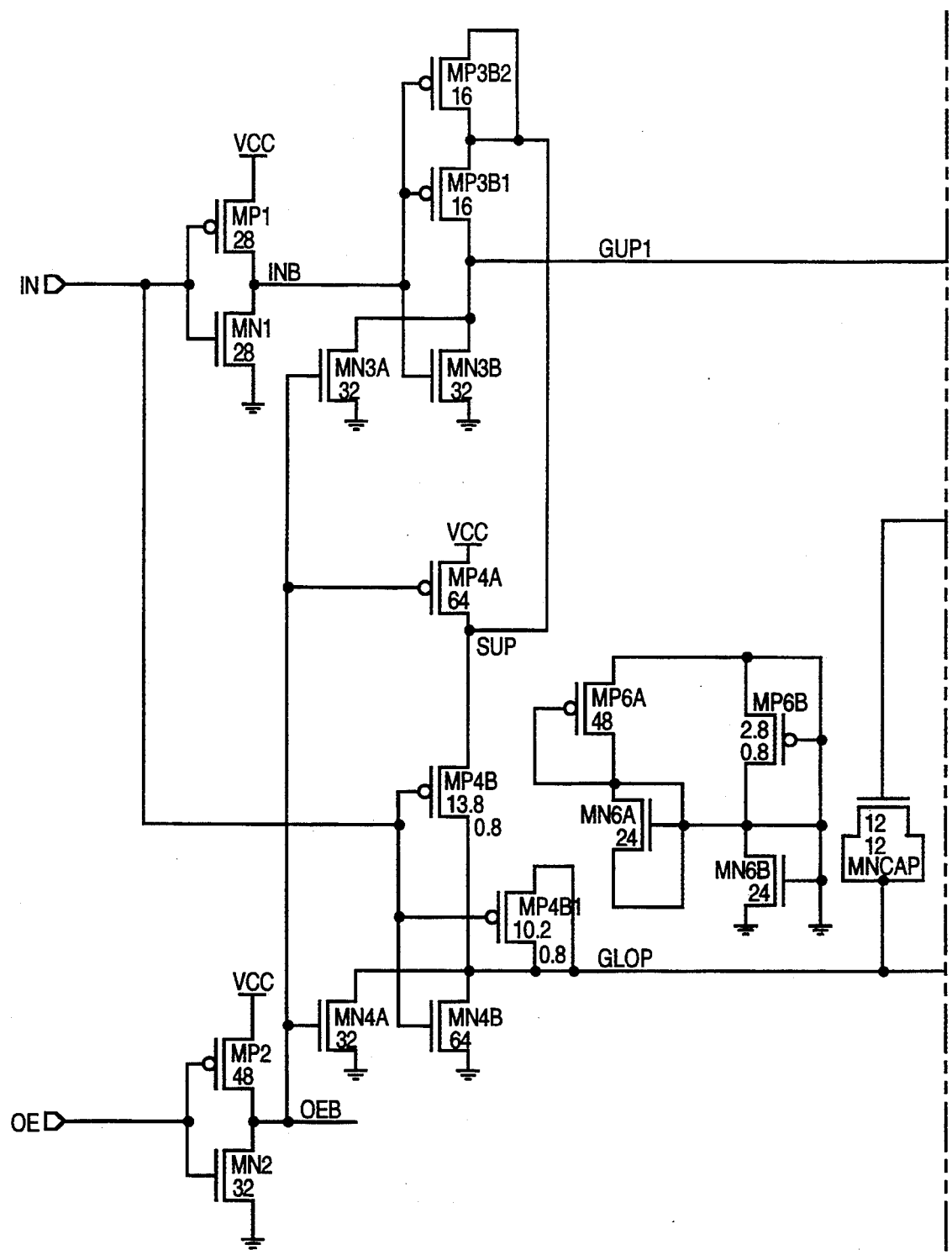
Figure 19B:
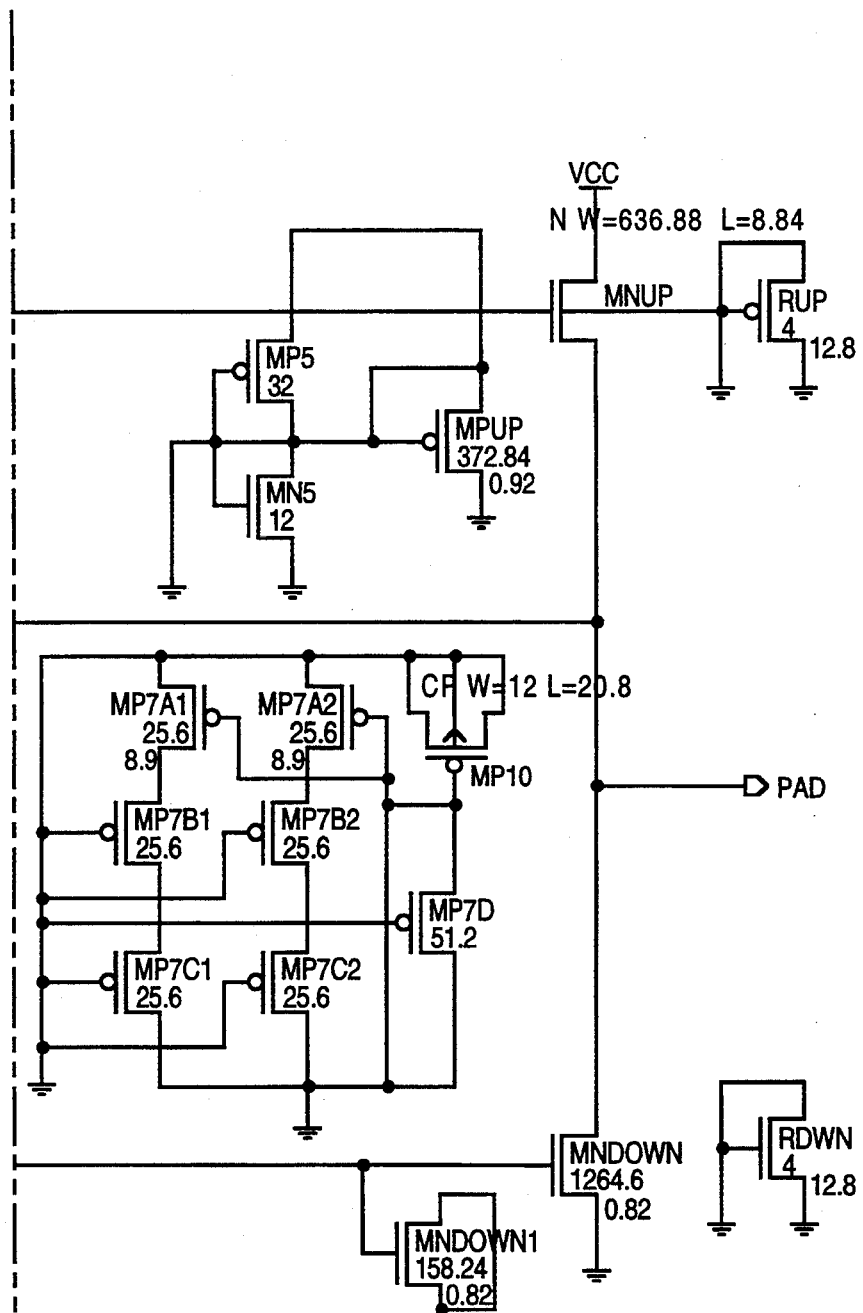

The structure of FIG. 19 corresponds with the embodiment of FIG. 3. Capacitor MNCAP is an additional Miller capacitance which is provided to feedback the falling output edge to the gate of the second output transistor MNDOWN.

Figure 20A:
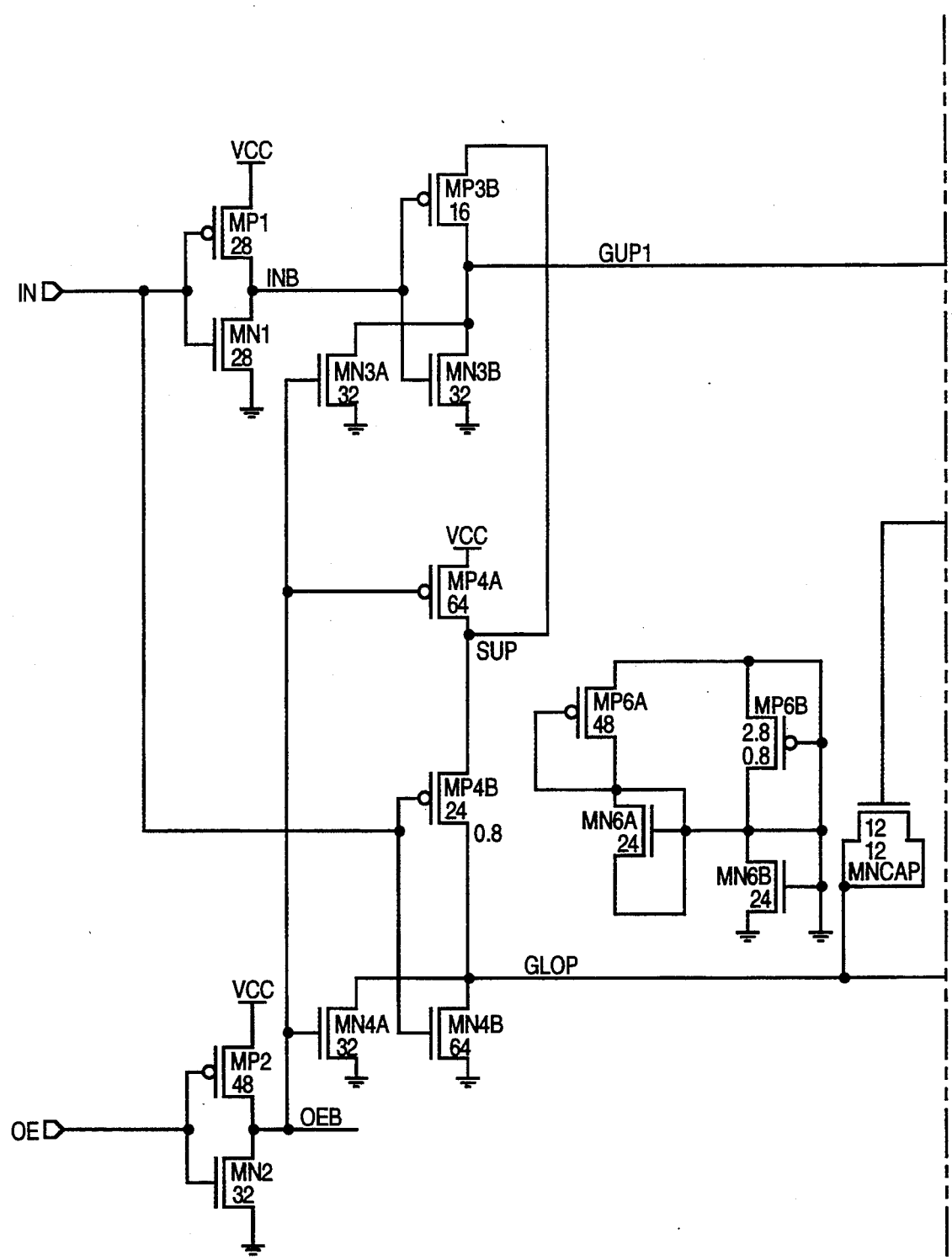
Figure 20B:
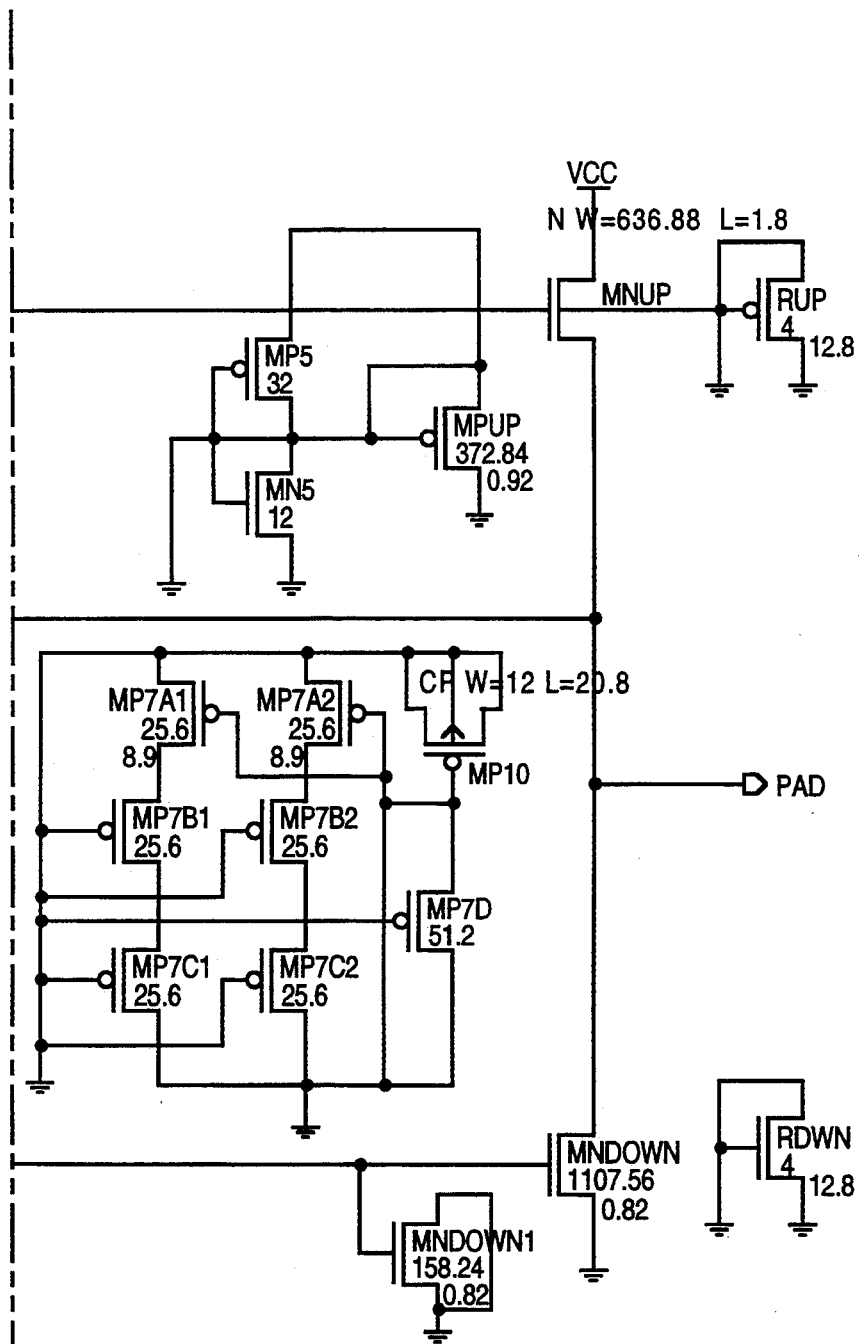

The structure of FIG. 20 corresponds with the embodiment shown in FIG. 3. This structure is similar to the structure of FIG. 19 except that transistor MP4B is made larger in the structure of FIG. 20. The structure of FIG. 19 is made to be slower than the structure shown in FIG. 20 by reducing the size of transistor MP4B. The structures of FIGS. 19 and 20 are examples of structures which reduce ground bounce by directly reducing the current drive of the second output transistor.

Figure 21A:
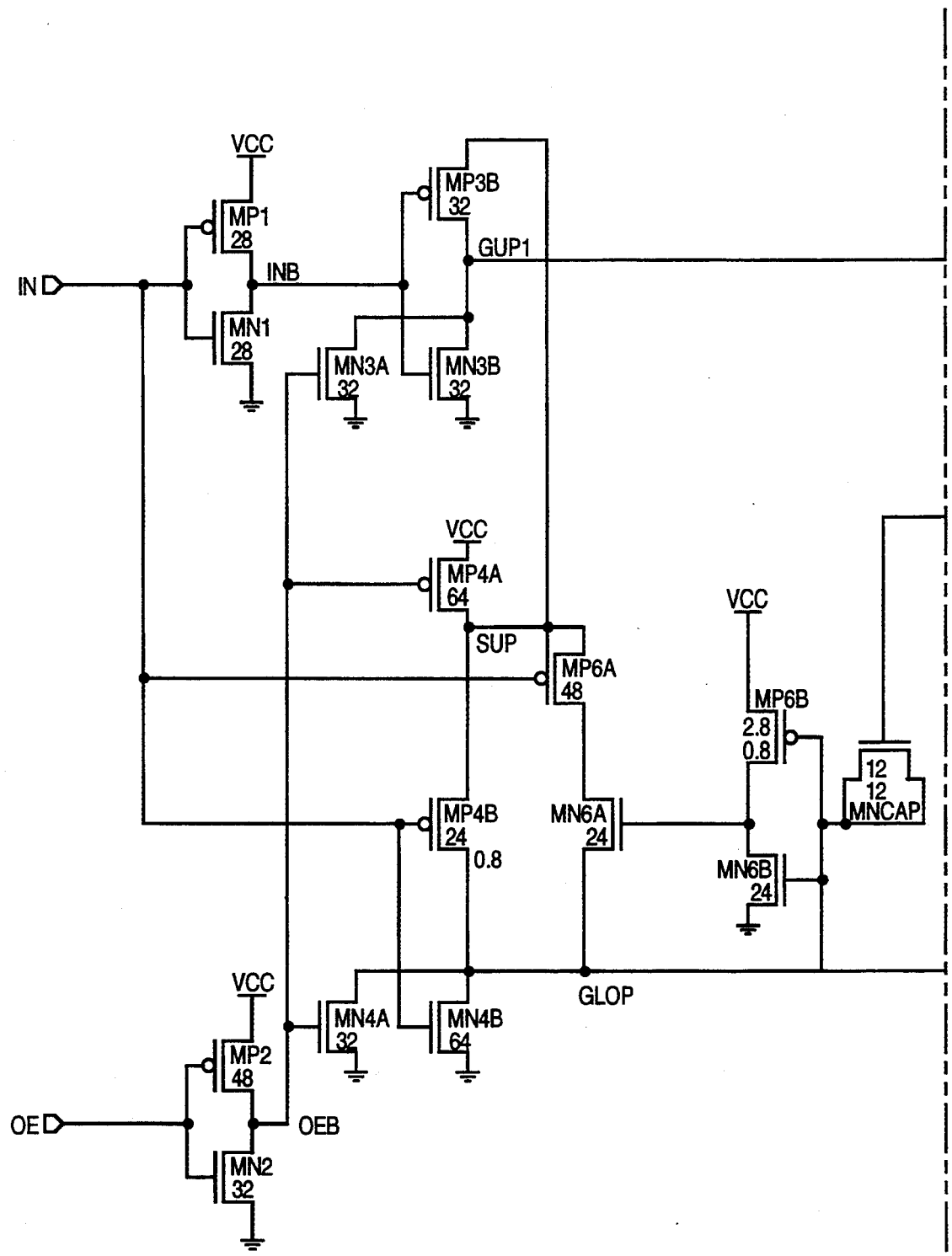
Figure 21B:
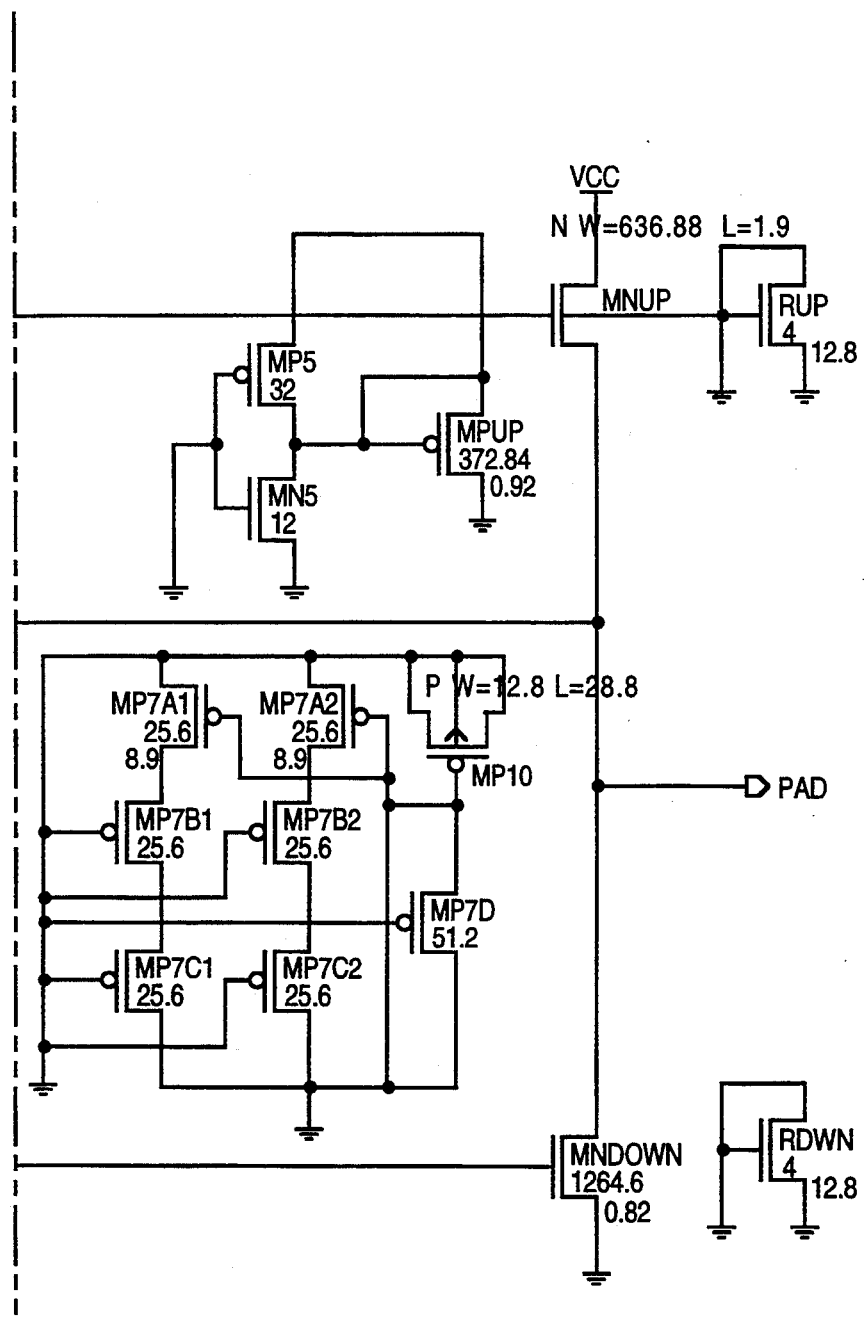

The backplane driver structure of FIG. 21 corresponds with the embodiment shown in FIG. 3.

While the invention has been described above with reference to particular embodiments, this description is solely for the purpose of illustration and is not to be construed as limiting the scope of the invention claimed below. For example, the conductivity types of semiconductor regions could be reversed from those described above to achieve similar results. The drive control circuit 314 may be fabricated in any suitable digital technology other than CMOS technology such as BiCMOS technology, TTL technology, or NMOS technology. Either one or both of the first and second transistors may be a suitable type of transistor other than a field effect transistor. Junction field effect transistors may be used for one or both of the first and second output transistors.

Bipolar transistors may, for example, be used for either or both of the first and second output transistors, the base of a bipolar transistor corresponding to the gate of an N-channel field effect transistor shown above, the collector of bipolar transistor corresponding to the drain of the N-channel field effect transistor shown above, the emitter of the bipolar transistor corresponding to the source of the N-channel field effect transistor shown above, and the bulk into which the base of the bipolar transistor is formed corresponding to the bulk region of the N-channel field effect transistor shown above. Accordingly, various modifications and adaptations of the above described embodiments may be made by those skilled in the art without departing from the true scope and spirit of the invention as defined in the appended claims.

We claim:

1. An output driver formed on a single integrated circuit die, comprising:

a drive control circuit which generates first and second control signals responsive to at least one digital input signal;

a first output field effect transistor having a source, a drain, and a gate, said gate being coupled to said first control signal, said source being coupled to a data output terminal, said source and said drain of said first output field effect transistor being disposed in a first semiconductor bulk region; and a second output field effect transistor having a source, a drain, and a gate, said gate of said second output field effect transistor being coupled to said second control signal, said drain of said second output field effect transistor being coupled to said source of said first output field effect transistor, said source and said drain of said second output field effect transistor being disposed in a second semiconductor bulk region, said source and said drain of said second output field effect transistor having an identical semiconductor conductivity type as a semiconductor conductivity type of said source and said drain of said first output field effect transistor; and a bulk potential control circuit which changes a voltage on said first semiconductor bulk region at least partly in response to said at least one digital input signal.

2. The output driver of claim 1, wherein said drive control circuit charges said gate of said second output field effect transistor at a first rapid rate and then subsequently charges said gate of said second output field effect transistor at a second slower rate.

3. The output driver of claim 1, wherein said bulk potential control circuit comprises a first transistor having a source, a drain, and a gate, said drain of said first transistor of said bulk potential control circuit being coupled to said source of said first output transistor, said source of said first transistor of said bulk potential control circuit being coupled to said first semiconductor bulk region, said gate of said first transistor of said bulk potential control circuit being coupled to said drive control circuit.

4. The output driver of claim 3, wherein said bulk potential control circuit further comprises a second transistor having a source, a drain, and a gate, said drain of said second transistor of said bulk potential control circuit being coupled to said source of said first transistor of said bulk potential control circuit, said source of said second transistor of said bulk potential control circuit being coupled to a voltage supply line, said gate of said second transistor of said bulk potential control circuit being coupled to said drive control circuit.

5. The output driver of claim 4, wherein said bulk potential control circuit further comprises a third transistor having a source, a drain, and a gate, said drain of said third transistor of said bulk potential control circuit being coupled to said source of said first transistor of said bulk potential control circuit, said source of said third transistor of said bulk potential control circuit being coupled to said voltage supply line, said gate of said third transistor of said bulk potential control circuit being coupled to said drive control circuit.

6. The output driver of claim 3, wherein said first transistor of said bulk potential control circuit is conductive when said output driver is both powered and enabled.

7. The output driver of claim 3, wherein said first transistor of said bulk potential control circuit turns on before said second output transistor turns on, said second output transistor turning on to pull an output voltage on said data output terminal from a high digital logic level voltage to a low digital logic level voltage, both said first transistor of said bulk potential control circuit and said second output transistor turning on in response to a digital output enable input signal.

8. The output driver of claim 4, wherein said second transistor of said bulk potential control circuit is conductive when said at least one digital input signal has a low digital logic level voltage during a time when said output driver is both powered and enabled.

9. The output driver of claim 4, wherein said second transistor of said bulk potential control circuit turns on before one of said first and second output transistors turns off, said one of said first and second output transistors turning off to disable said data output terminal.

10. The output driver of claim 3, wherein said source and said drain of first transistor of said bulk potential control circuit are disposed in said first semiconductor bulk region.

11. The output driver of claim 7, wherein said first transistor of said bulk potential control circuit is sized to discharge a capacitance of said first semiconductor bulk region before said second output transistor turns on during a high-to-low transition of said output voltage on said data output terminal.

12. The output driver of claim 1, further comprising:
a first resistive element coupled between said drain of said first output field effect transistor and a first voltage supply line; and
a second resistive element coupled between said source of said second output field effect transistor and a second voltage supply line.

13. An output driver formed on a single integrated circuit die, comprising:
means for generating first and second control signals responsive to at least one digital input signal;
a first output field effect transistor having a source, a drain, and a gate, said gate being coupled to said first control signal, said source being coupled to a data output terminal, said source and said drain of said first output field effect transistor being disposed in a first semiconductor bulk region;
a second output field effect transistor having a source, a drain, and a gate, said gate of said second output field effect transistor being coupled to said second control signal, said drain of said second output field effect transistor being coupled to said source of said first output field effect transistor, said source and said drain of said second output field effect transistor being disposed in a second semiconductor bulk region, said source and said drain of said second output field effect transistor having an identical semiconductor conductivity type as a semiconductor conductivity type of said source and said drain of said first output field effect transistor; and
means for changing a voltage on said first semiconductor bulk region at least partly in response to said at least one digital input signal.

14. The output driver of claim 13, further comprising:
a first resistive element coupled between said drain of said first output field effect transistor and a first voltage supply line; and
a second resistive element coupled between said source of said second output field effect transistor and a second voltage supply line.

* * * * *